United States Patent
Kim

(10) Patent No.: US 10,050,095 B2
(45) Date of Patent: Aug. 14, 2018

(54) TRANSPARENT ORGANIC LIGHT-EMITTING DIODE DISPLAY WITH CAPACITOR OVERLAPPING LIGHT TRANSMITTING REGION

(71) Applicant: Samsung Display Co., Ltd., Yongin-si, Gyeonggi-do (KR)

(72) Inventor: Daewoo Kim, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 65 days.

(21) Appl. No.: 15/176,028

(22) Filed: Jun. 7, 2016

(65) Prior Publication Data

US 2017/0148861 A1 May 25, 2017

(30) Foreign Application Priority Data

Nov. 23, 2015 (KR) .................. 10-2015-0163973

(51) Int. Cl.
*H01L 27/32* (2006.01)
*H01L 51/56* (2006.01)

(52) U.S. Cl.
CPC ........ *H01L 27/3265* (2013.01); *H01L 27/326* (2013.01); *H01L 27/3211* (2013.01); *H01L 27/3246* (2013.01); *H01L 27/3276* (2013.01); *H01L 51/56* (2013.01); *H01L 2227/323* (2013.01)

(58) Field of Classification Search
None
See application file for complete search history.

(56) References Cited

U.S. PATENT DOCUMENTS

| | | |
|---|---|---|
| 2007/0176177 A1 | 8/2007 | Jung et al. |
| 2010/0020259 A1 | 1/2010 | Park et al. |
| 2010/0038648 A1 | 2/2010 | Cho et al. |
| 2011/0169720 A1 | 7/2011 | Hwang et al. |
| 2012/0080663 A1 | 4/2012 | Lee et al. |
| 2012/0169217 A1 | 7/2012 | Kim et al. |

(Continued)

FOREIGN PATENT DOCUMENTS

| | | |
|---|---|---|
| KR | 10-2007-0076860 A | 7/2007 |
| KR | 10-2010-0010534 A | 2/2010 |

(Continued)

*Primary Examiner* — Lex Malsawma
(74) *Attorney, Agent, or Firm* — Knobbe Martens Olson & Bear LLP

(57) ABSTRACT

An organic light-emitting diode (OLED) display is disclosed. In one aspect, the OLED display includes a substrate having a main surface and a pixel provided over the main surface of the substrate and defined by a first region configured to display an image and a second region configured to transmit external light. The pixel includes a first electrode electrically provided in the first region, and a pixel defining layer provided in at least the first region, wherein the pixel defining layer has a first opening exposing a part of the first electrode and a second opening disposed in the second region. The pixel also includes a second electrode facing the first electrode and an intermediate layer disposed between the first and second electrodes and comprising an organic emission layer. The first capacitor at least partially overlaps the second opening along a direction perpendicular to the main surface.

22 Claims, 18 Drawing Sheets

(56) References Cited

U.S. PATENT DOCUMENTS

| | | | |
|---|---|---|---|
| 2012/0169683 A1 | 7/2012 | Hong | |
| 2014/0183479 A1* | 7/2014 | Park | H01L 51/56 257/40 |
| 2014/0353609 A1 | 12/2014 | Song | |
| 2015/0137101 A1* | 5/2015 | Choi | H01L 51/5209 257/40 |
| 2015/0179724 A1* | 6/2015 | Lee | H01L 27/3241 257/40 |
| 2016/0064411 A1* | 3/2016 | Park | H01L 27/124 257/89 |
| 2016/0126494 A1* | 5/2016 | Jung | H01L 27/3258 257/72 |
| 2016/0133681 A1* | 5/2016 | Nam | H01L 51/5265 257/40 |
| 2016/0351645 A1* | 12/2016 | You | H01L 27/326 |

FOREIGN PATENT DOCUMENTS

| | | |
|---|---|---|
| KR | 10-2010-0020140 A | 2/2010 |
| KR | 10-2012-0035419 A | 4/2012 |
| KR | 10-2012-0078954 A | 7/2012 |
| KR | 10-2012-0079318 A | 7/2012 |
| KR | 10-2014-0140414 A | 12/2014 |

\* cited by examiner

TRANSPARENT ORGANIC LIGHT-EMITTING DIODE DISPLAY WITH CAPACITOR OVERLAPPING LIGHT TRANSMITTING REGION

CROSS-REFERENCE TO RELATED APPLICATION

This application claims the benefit of Korean Patent Application No. 10-2015-0163973, filed on Nov. 23, 2015, in the Korean Intellectual Property Office, the disclosure of which is incorporated herein in its entirety by reference.

BACKGROUND

Field

The described technology generally relates to an organic light-emitting diode (OLED) display and a method of manufacturing the same.

Description of the Related Technology

An OLED display includes many OLEDs each including a hole injection electrode, an electron injection electrode, and an organic emission layer therebetween. Holes injected from the hole injection electrode and electrons injected from the electron injection electrode combine in the organic emission layer, thereby generating excitons, and when the excitons decay from an excited state to a ground state, light is emitted. Each OLED is driven by a pixel circuit and the combination of OLEDs is used to display images.

Since an OLED is self-emissive, it does not require a separate light source. Therefore, OLED technology has desirable characteristics such as a broad viewing angle, low power consumption, thin profile, high contrast, short response time. OLED displays have been widely used from personal portable devices, such as MP3 players and portable terminals, to televisions (TVs) and so on.

In such OLED displays, a see-through type, which enables a user to recognize an external background as well as a displayed image realized by the OLED display, is being researched.

SUMMARY OF CERTAIN INVENTIVE ASPECTS

One inventive aspect relates to a see-through OLED display and a method of manufacturing the same, which enable a user to recognize an external background as well as an image realized by the OLED display.

Another aspect is an OLED display that includes: a substrate including a main surface; and a pixel provided over the main surface of the substrate and including a first region configured to display an image and a second region through which external light is transmitted, wherein the pixel includes: a first transistor provided in the first region; a first capacitor provided in the second region and including a first lower electrode and a first upper electrode facing the first lower electrode; a first electrode electrically connected to the first transistor and provided in the first region; a pixel defining layer provided in at least the first region and including a first opening exposing a part of the first electrode and a second opening corresponding to the second region; a second electrode facing the first electrode; and an intermediate layer disposed between the first electrode and the second electrode and including an organic emission layer, wherein at least a part of the first capacitor overlaps with at least a part of the second opening along a direction perpendicular to the main surface.

The first lower electrode of the first capacitor may include polysilicon, and the first upper electrode of the first capacitor may include transparent conductive oxide.

The transparent conductive oxide may include indium tin oxide (ITO) having a thickness in a range from about 100 Å to about 500 Å.

The first transistor may include an active layer and a gate electrode insulated from the active layer.

The gate electrode may include a lower gate electrode and an upper gate electrode provided over the lower gate electrode.

An upper surface of the lower gate electrode and a lower surface of the upper gate electrode are in contact with each other, and a width of the upper surface of the lower gate electrode is less than a width of the lower surface of the upper gate electrode.

The first lower electrode of the first capacitor is provided at a same layer as the active layer, and the first upper electrode of the first capacitor is provided at a same layer as the lower gate electrode.

The gate electrode of the first transistor is electrically connected to the first upper electrode of the first capacitor.

The OLED display may further include: a source electrode and a drain electrode provided over the gate electrode and electrically connected to the active layer; a gate insulating layer disposed between the active layer and the gate electrode; an interlayer insulating layer disposed between the gate electrode and the source electrode and between the gate electrode and the drain electrode; and a via insulating layer provided over the interlayer insulating layer to cover the source electrode and the drain electrode.

The OLED display may further include: a second capacitor provided in the first region and electrically connected to the first capacitor.

The second capacitor may include a second lower electrode provided at a same layer as the gate electrode and a second upper electrode provided at a same layer as the source electrode and the drain electrode.

The gate insulating layer and the interlayer insulating layer have a single layer structure including an inorganic material or a double layer structure, and wherein the via insulating layer has a single layer structure including an organic material.

The interlayer insulating layer and the via insulating layer may include a third opening and a fourth opening that correspond with the second region, respectively, and wherein at least a part of the first upper electrode is exposed by the second opening, the third opening, and the fourth opening.

The intermediate layer may include a first common layer disposed between the first electrode and the organic emission layer and a second common layer disposed between the organic emission layer and the second electrode, and wherein the first common layer and the second common layer extend from the first region to an upper surface of the first upper electrode.

The second electrode may include an opening corresponding to the second region.

An area of the third opening is greater than an area of the fourth opening, and wherein the via insulating layer may include a region in direct contact with a part of the upper surface of the first upper electrode.

The OLED display may further include: a second capacitor, wherein the second capacitor may include the gate electrode and a second upper electrode facing the gate electrode of the first transistor.

A ratio of an area of the second opening with respect to an entire area of the pixel is in a range from about 40% to about to about 90%.

A ratio of an area of a region of the first capacitor overlapping with the second opening with respect to the area of the second opening is in a range from about 3% to about 9%.

The pixel may include a plurality of pixels including a first pixel, a second pixel, a third pixel, and a fourth pixel disposed along a first direction, and wherein scan lines or data lines extend along a second direction crossing the first direction at least between the first pixel and the second pixel and between the third pixel and the fourth pixel.

The second region of the second pixel and the second region of the third pixel are connected to each other along the first direction.

Each of the first through fourth pixels may include a first subpixel, a second subpixel, and a third subpixel disposed in the first region, and wherein the first subpixel, the second subpixel, and the third subpixel emit a red light, a green light, and a blue light, respectively.

Another aspect is a method of manufacturing an OLED display that includes preparing a substrate including a first region configured to display an image and a second region through which external light is transmitted; forming a first semiconductor pattern and a second semiconductor pattern on the first region and the second region of the substrate; forming a first insulating material over the substrate to cover the first semiconductor pattern and the second semiconductor pattern; sequentially forming transparent conductive oxide and a first conductive material over the first insulating material; forming a gate electrode of a first transistor facing at least a part of the first semiconductor pattern and including a lower gate electrode and an upper gate electrode and a conductive pattern facing the second semiconductor pattern and including a first upper electrode and the upper conductive layer by patterning the transparent conductive oxide and the first conductive material by using a first mask; forming an active layer of the first transistor by doping the first semiconductor pattern with impurities by using the gate electrode as a mask; removing the upper conductive layer of the conductive pattern forming a first lower electrode constituting a first capacitor along with the first upper electrode by doping the second semiconductor pattern with impurities; and forming an organic light-emitting device electrically connected to the first transistor.

The forming of the gate electrode and the conductive pattern may include: forming a first photoresist to cover the transparent conductive oxide and the first conductive material; irradiating light onto the first photoresist by using the first mask; removing a region of the first photoresist onto which light is irradiated; etching the first conductive material by using a first etching solution; and etching the transparent conductive oxide by using a second etching solution.

The forming of the transparent conductive oxide may include: forming the transparent conductive oxide having a thickness in a range from about 100 Å to about 500 Å.

The forming of the organic light-emitting device may include: forming a first electrode electrically connected to the first transistor; forming an insulating material covering the first electrode; forming a pixel defining layer including a first opening exposing the first electrode and a second opening exposing the first upper electrode by patterning the insulating material; forming an intermediate layer including an organic emission layer over the exposed first electrode; and forming a second electrode over the intermediate layer.

The method may further include: after forming the active layer, forming a second insulating material over the first insulating material to cover the gate electrode and the conductive pattern; and forming a gate insulating layer and an interlayer insulating layer by patterning the first insulating material and the second insulating material by using a second mask, wherein the second mask is a halftone mask including a semi-transmitting portion corresponding to a peripheral region of the first capacitor.

The method may further include: forming a second conductive material over the gate insulating layer and the interlayer insulating layer; and forming a source electrode and a drain electrode of the first transistor by patterning the second conductive material, wherein the patterning of the second conductive material and the removing of the upper conductive layer of the conductive pattern are simultaneously performed.

The method may further include: before forming the organic light-emitting device, forming a via insulating layer over the interlayer insulating layer to cover the source electrode and the drain electrode and including a third opening exposing a part of the first upper electrode.

Another aspect is an organic light-emitting diode (OLED) display comprising: a substrate having a main surface; and a pixel provided over the main surface of the substrate and defined by a first region configured to display an image and a second region configured to transmit external light, wherein the pixel comprises: a first transistor provided in the first region; a first capacitor provided in the second region and comprising a first lower electrode and a first upper electrode facing the first lower electrode; a first electrode electrically connected to the first transistor and provided in the first region; a pixel defining layer provided in at least the first region, wherein the pixel defining layer has a first opening exposing a part of the first electrode and a second opening formed in the second region; a second electrode opposing the first electrode; and an intermediate layer disposed between the first and second electrodes and comprising an organic emission layer, wherein the first capacitor at least partially overlaps the second opening along a direction perpendicular to the main surface.

In the above OLED display, the first lower electrode of the first capacitor comprises polysilicon, and wherein the first upper electrode of the first capacitor comprises transparent conductive oxide. In the above OLED display, the transparent conductive oxide comprises indium tin oxide (ITO) having a thickness in a range from about 100 Å to about 500 Å. In the above OLED display, the first transistor comprises an active layer and a gate electrode insulated from the active layer. In the above OLED display, the gate electrode comprises a lower gate electrode and an upper gate electrode provided over the lower gate electrode. In the above OLED display, an upper surface of the lower gate electrode and a lower surface of the upper gate electrode are in contact with each other, and wherein the upper surface of the lower gate electrode has a width less than that of the lower surface of the upper gate electrode.

In the above OLED display, the first lower electrode of the first capacitor is provided on the same layer as the active layer, and wherein the first upper electrode of the first capacitor is provided on the same layer as the lower gate electrode. In the above OLED display, the gate electrode of the first transistor is electrically connected to the first upper electrode of the first capacitor. The above OLED display further comprises: a source electrode and a drain electrode provided over the gate electrode and electrically connected to the active layer; a gate insulating layer disposed between the active layer and the gate electrode; an interlayer insulating layer disposed between the gate electrode and the source electrode and between the gate electrode and the drain electrode; and a via insulating layer provided over the interlayer insulating layer to cover the source and drain electrodes. The above OLED display further comprises: a second capacitor provided in the first region and electrically connected to the first capacitor.

In the above OLED display, the second capacitor comprises a second lower electrode provided on the same layer as the gate electrode and a second upper electrode provided on the same layer as the source and drain electrodes. In the above OLED display, the gate insulating layer and the interlayer insulating layer have a single layer structure including an inorganic material or a double layer structure, and wherein the via insulating layer has a single layer structure including an organic material.

In the above OLED display, the interlayer insulating layer and the via insulating layer respectively have a third opening and a fourth opening formed in the second region, and wherein at least a part of the first upper electrode is exposed by the second opening, the third opening, and the fourth opening. In the above OLED display, the intermediate layer comprises a first common layer disposed between the first electrode and the organic emission layer and a second common layer disposed between the organic emission layer and the second electrode, and wherein the first and second common layers extend from the first region to an upper surface of the first upper electrode. In the above OLED display, the second electrode has an opening formed in the second region.

In the above OLED display, the third opening is greater in area than the fourth opening, and wherein the via insulating layer comprises a region in direct contact with a part of the upper surface of the first upper electrode. The above OLED display further comprises: a second capacitor, wherein the second capacitor comprises the gate electrode and a second upper electrode facing the gate electrode of the first transistor. In the above OLED display, a ratio of an area of the second opening with respect to an entire area of the pixel is in a range from about 40% to about to about 90%. In the above OLED display, a ratio of an area of a region of the first capacitor overlapping the second opening with respect to the area of the second opening is in a range from about 3% to about 9%.

In the above OLED display, the pixel comprises a plurality of pixels comprising a first pixel, a second pixel, a third pixel, and a fourth pixel disposed along a first direction, and wherein scan lines or data lines extend along a second direction crossing the first direction at least between the first and second pixels and between the third and fourth pixels. In the above OLED display, the second region of the second pixel and the second region of the third pixel are connected to each other along the first direction. In the above OLED display, each of the first through fourth pixels comprises a first subpixel, a second subpixel, and a third subpixel disposed in the first region, and wherein the first subpixel, the second subpixel, and the third subpixel are configured to respectively emit a red light, a green light, and a blue light, respectively.

Another aspect is a method of manufacturing an organic light-emitting diode (OLED) display, the method comprising: preparing a substrate comprising a first region configured to display an image and a second region configured to transmit external light; forming a first semiconductor pattern and a second semiconductor pattern respectively on the first region and the second region of the substrate; forming a first insulating material over the substrate to cover the first and second semiconductor patterns; sequentially forming transparent conductive oxide and a first conductive material over the first insulating material; patterning the transparent conductive oxide and the first conductive material by using a first mask so as to form a gate electrode of a first transistor and a conductive pattern, wherein the gate electrode faces at least a part of the first semiconductor pattern and comprises a lower gate electrode and an upper gate electrode and wherein the conductive pattern faces the second semiconductor pattern and comprises a first upper electrode and the upper conductive layer; doping the first semiconductor pattern with impurities by the use of the gate electrode as a mask so as form an active layer of the first transistor; removing the upper conductive layer of the conductive pattern; doping the second semiconductor pattern with impurities so as to form a first lower electrode constituting a first capacitor along with the first upper electrode; and forming an OLED electrically connected to the first transistor.

In the above method, the forming of the gate electrode and the conductive pattern comprises: forming a first photoresist to cover the transparent conductive oxide and the first conductive material; irradiating light onto the first photoresist via the first mask; removing a region of the first photoresist onto which light is irradiated; etching the first conductive material by the use of a first etching solution; and etching the transparent conductive oxide by the use of a second etching solution. In the above method, the forming of the transparent conductive oxide comprises: forming the transparent conductive oxide having a thickness in a range from about 100 Å to about 500 Å. In the above method, the forming of the OLED comprises: forming a first electrode electrically connected to the first transistor; forming an insulating material covering the first electrode; patterning the insulating material so as to form a pixel defining layer having a first opening exposing the first electrode and a second opening exposing the first upper electrode; forming an intermediate layer comprising an organic emission layer over the exposed first electrode; and forming a second electrode over the intermediate layer.

The above method further comprises: after forming the active layer, forming a second insulating material over the first insulating material to cover the gate electrode and the conductive pattern; and patterning the first and second insulating materials via a second mask so as to form a gate insulating layer and an interlayer insulating layer, wherein the second mask is a halftone mask comprising a semi-transmitting portion corresponding to a peripheral region of the first capacitor. The above method further comprises: forming a second conductive material over the gate insulating layer and the interlayer insulating layer; and patterning the second conductive material so as to form a source electrode and a drain electrode of the first transistor, wherein the patterning of the second conductive material and the removing of the upper conductive layer of the conductive pattern are concurrently performed. The above method further comprises: before forming the OLED, forming a via insulating layer over the interlayer insulating layer to cover the source and drain electrodes and comprising a third opening exposing a part of the first upper electrode.

Another aspect is an organic light-emitting diode (OLED) display comprising: a substrate having a main surface; and a pixel provided over the main surface of the substrate and defined by a first region configured to display an image and a second region configured to transmit external light, wherein the pixel comprises: a first transistor provided in the first region; a first capacitor provided in the second region and comprising a first lower electrode and a first upper electrode facing the first lower electrode; a first electrode electrically connected to the first transistor and provided in the first region; and a pixel defining layer provided in at least the first region, wherein the pixel defining layer has a first opening exposing a part of the first electrode and a second opening formed in the second region, wherein the first capacitor at least partially overlaps the second opening in the depth dimension of the OLED display.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

Figure 1:
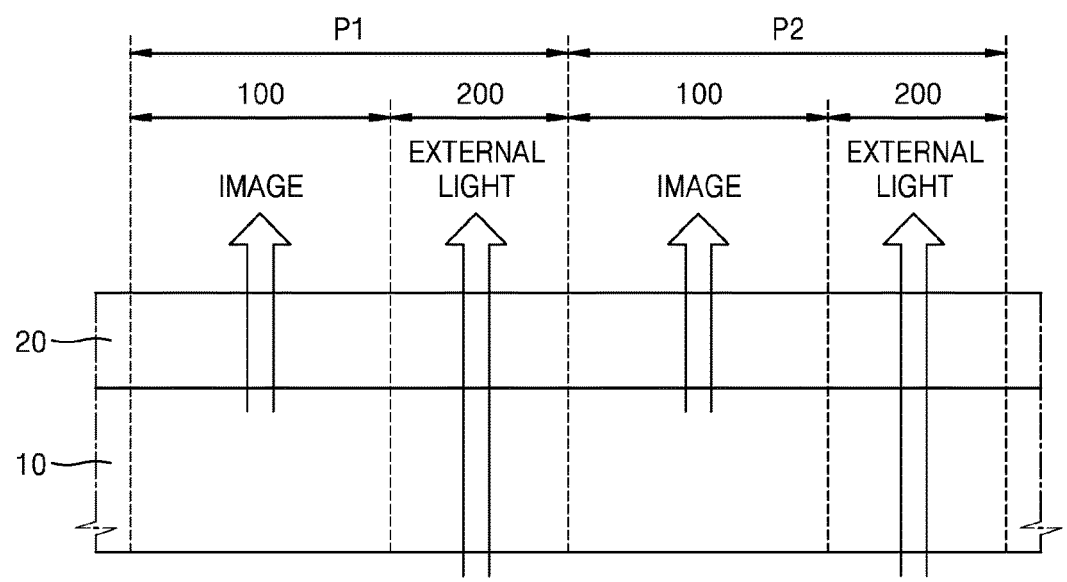
FIG. 1 is a cross-sectional view schematically illustrating an OLED display according to an embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The effects and features of the present invention will become apparent from the following description of the embodiments with reference to the accompanying drawings. The present invention may, however, may be embodied in different forms and should not be construed as being limited to the embodiments set forth herein.

Hereinafter, embodiments of the present invention will be described in detail with reference to the accompanying drawings. In the present specification and drawings, like reference numerals refer to like elements throughout.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

Sizes of elements in the drawings may be exaggerated for convenience of explanation. In other words, since sizes and thicknesses of components in the drawings are arbitrarily illustrated for convenience of explanation, the described technology is not limited thereto.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Hereinafter, embodiments will be described in detail with reference to the accompanying drawings.

FIG. 1 is a cross-sectional view schematically illustrating an OLED display according to an embodiment.

Referring to FIG. 1, the OLED display includes a substrate 10 and a display unit 20, which is disposed over the substrate 10 and includes a plurality of pixels P1 and P2 each including a first region 100 emitting light and a second region 200 through which external light is transmitted. External light denotes light which is incident on the OLED display from the environment. External light incident on one surface of the OLED display may pass through the substrate 10 and the display unit 20, may pass through the other surface opposite to the one surface of the OLED display, and may be recognized by a user.

That is, a user located on a side where an image is realized may view a background image outside the substrate 10. In the embodiment of FIG. 1, a top emission type where an image displayed by the display unit 20 is realized in a direction opposite to the substrate 10, but the described technology is not limited thereto. That is, an OLED display according to another embodiment may be a bottom emission type where an image displayed by the display unit 20 is realized in a direction toward the substrate 10, or a dual emission type where an image displayed by the display unit 20 is realized in the direction toward the substrate 10 and in the direction opposite to the substrate 10.

In FIG. 1, a first pixel P1 and a second pixel P2, which are two pixels adjacent to each other in the OLED display according to an embodiment, are illustrated. Each of the pixels P1 and P2 includes the first region 100 and the second region 200. An image may be realized from the first region 100 of the display unit 20, and external light may be transmitted through the second region 200. Although not shown in FIG. 1, the second region 200 may be disposed to be connected to a plurality of pixels.

An element, including opaque metal like a thin film transistor (TFT), a capacitor, and an OLED, may not be disposed in the second region 200. Due to such a configuration, external light transmittance of the second region 200 increases.

Figure 2:
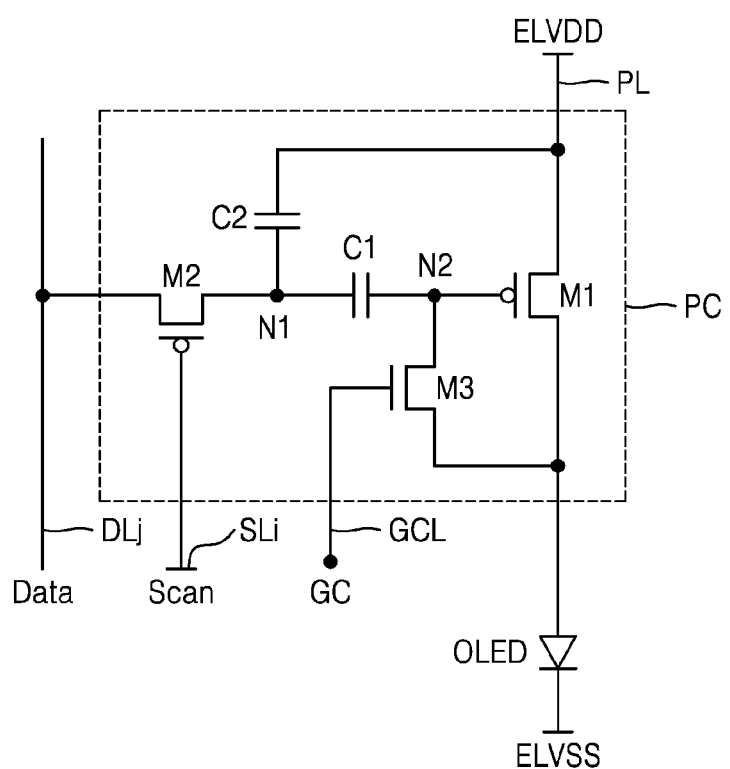
FIG. 2 is an equivalent circuit diagram of one sub-pixel of an OLED display according to an embodiment.

FIG. 2 is an equivalent circuit diagram of one sub-pixel of an OLED display according to an embodiment.

Each of the first and second pixels P1 and P2 of FIG. 1 may include a plurality of sub-pixels that emit different colors of light. An example sub-pixel is shown in FIG. 2. Each of the sub-pixels may include an OLED and a pixel circuit PC that drives the OLED. The pixel circuit may include at least one transistor and at least one capacitor and may be electrically connected to a plurality of wirings that apply voltage, a scan signal or a data signal. The pixel circuit PC may include three transistors M1 through M3 and two capacitors C1 and C2. However, the numbers of transistors and capacitors are not limited thereto.

The transistors M1 through M3 may include a first transistor M1, a second transistor M2, and a third transistor M3. The capacitors C1 and C2 may include a first capacitor C1 and a second capacitor C2.

The second transistor M2 may include a gate electrode connected to a scan line SLi, a source electrode connected to a data line DLj, and a drain electrode connected to a first node N1. The second transistor M2 may be turned on by a scan signal Scan input to the scan line SLj and may transfer a data signal Data input to the source electrode through the data line DLj to the first node N1.

Figure 4:
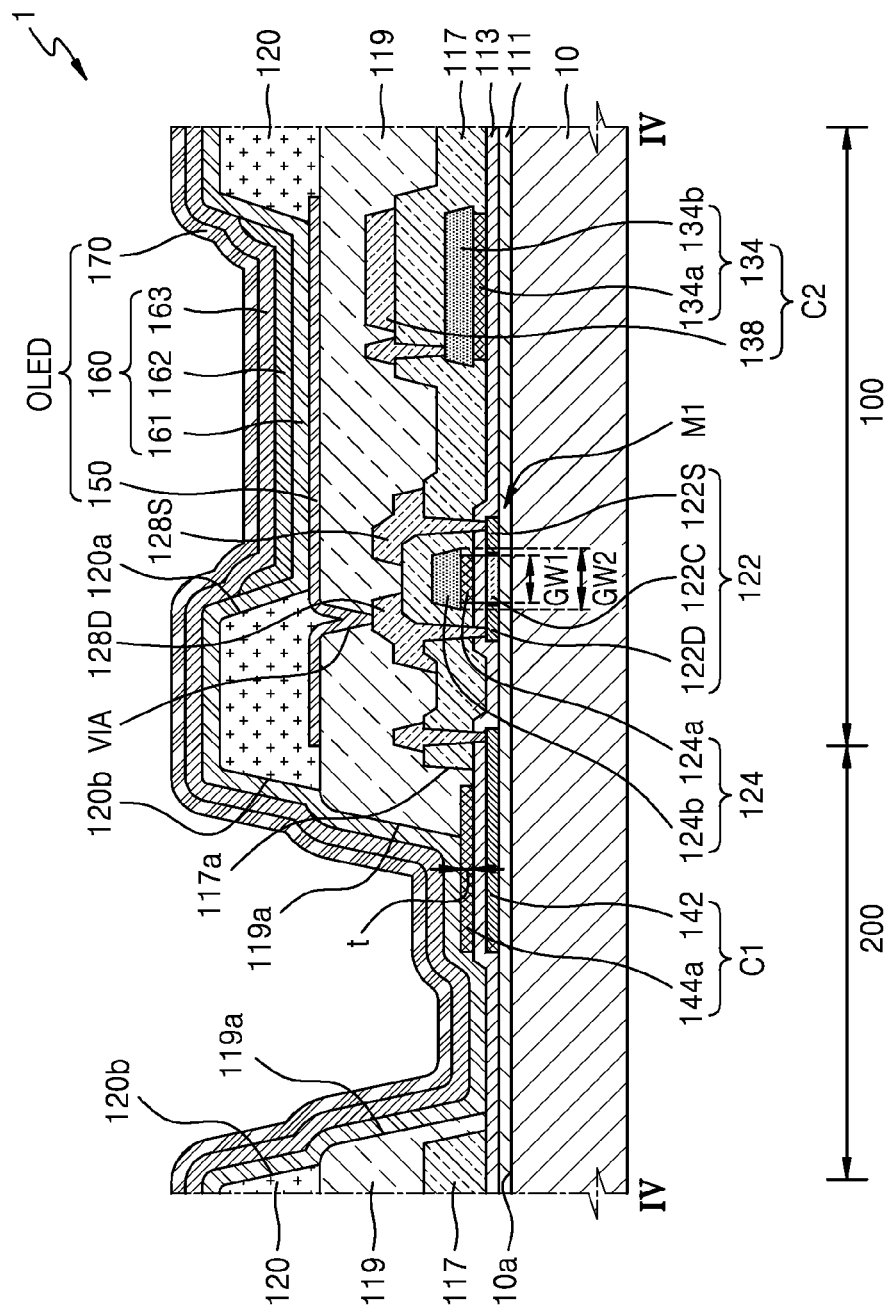
FIG. 4 is a cross-sectional view taken along line IV-IV of FIG. 3.

The first transistor M1 may include a gate electrode connected to a second node N2, a source electrode connected to a power line PL via which a first power voltage DLVDD is supplied, and a drain electrode connected to a first electrode 150 of FIG. 4 of the OLED. The first transistor M1 may function as a driving transistor and may be turned on or off by a voltage of the second node N2 to control current supplied to the OLED.

The third transistor M3 may include a gate electrode connected to a compensation control line GCL via which a compensation control signal GC is supplied, a drain electrode connected to the gate electrode of the first transistor M1, and a source electrode connected to the first electrode 150 of FIG. 4 of the OLED and the drain electrode of the first transistor M1. When the third transistor M3 is turned on by the compensation control signal GC applied to the gate electrode of the third transistor M3, the first transistor M1 may be diode-connected.

The first capacitor C1 may be connected between the first node N1 and the second node N2. The second capacitor C2 may be connected to the power line PL and the first node N1. The second capacitor C2 may be a storage capacitor that stores a voltage corresponding to a voltage difference between the first power voltage ELVDD and the first node N1 and maintains the voltage for a certain time. The first capacitor C1, along with the third transistor M3, may compensate for a threshold voltage Vth of the first transistor M1.

The first electrode 150 of FIG. 4 may be connected to the pixel circuit PC. A second power voltage ELVSS may be applied to a second electrode 170 of FIG. 4. The OLED may emit light having a certain brightness in correspondence to current supplied from the pixel circuit PC. According to an embodiment, the OLED may emit a red light, a green light, a blue light, or a white light.

According to an embodiment, the first through third transistors M1 through M3 may be p-channel field effect transistors but the described technology is not limited thereto. At least some of the first through third transistors M1 through M3 may be n-channel field effect transistors.

Figure 3:
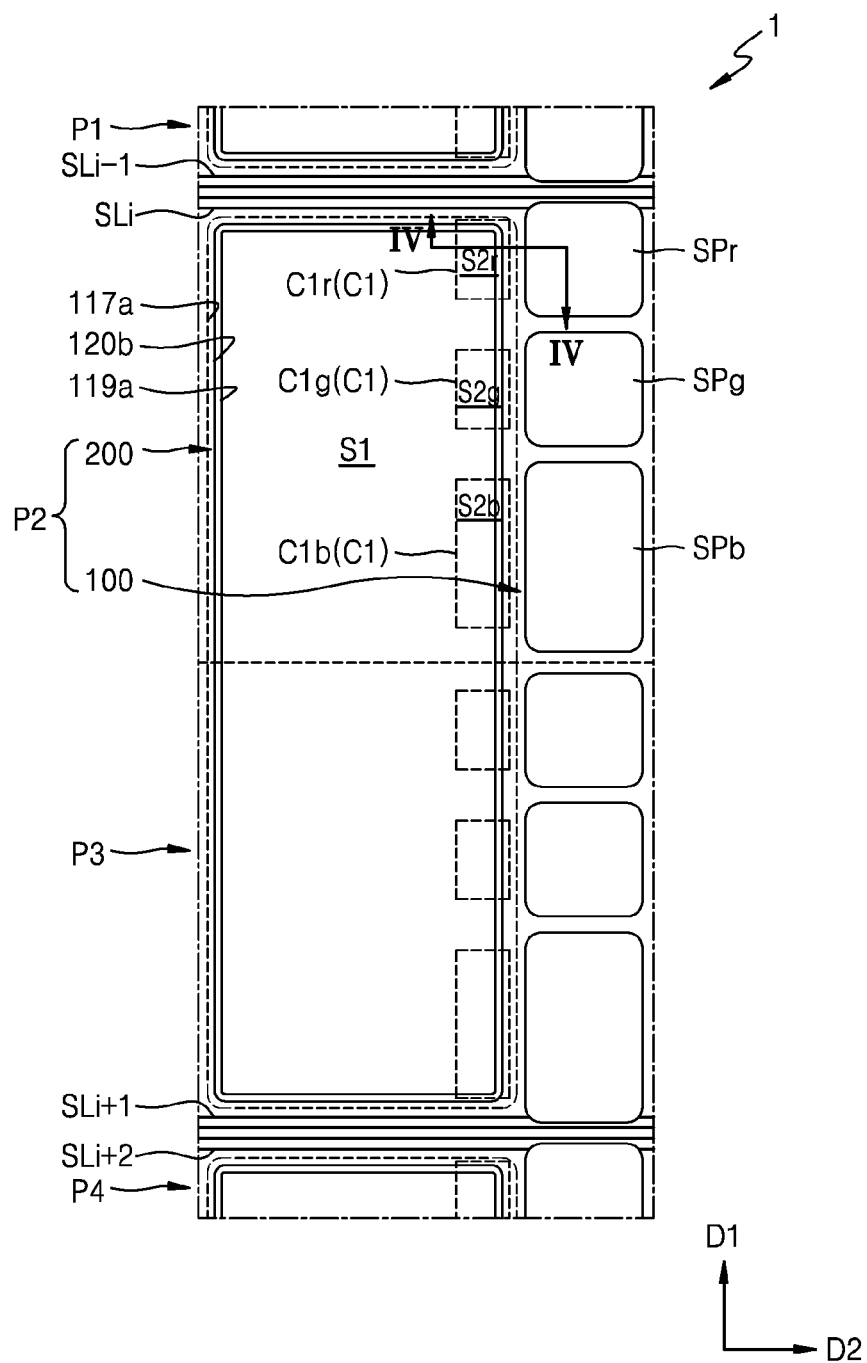
FIG. 3 is a plan view schematically illustrating a plurality of pixels included in an OLED display according to an embodiment.

FIG. 3 is a plan view schematically illustrating a plurality of pixels included in an OLED display 1 according to an embodiment. FIG. 4 is a cross-sectional view taken along line IV-IV of FIG. 3.

Referring to FIGS. 3 and 4, the OLED display 1 includes a substrate 10 including a main surface 10a and the pixel P2 disposed on the main surface 10a of the substrate 10 and includes a first region 100 configured to display an image and a second region 200 through which external light is transmitted. The pixel P2 may include the first transistor M1 provided in the first region 100, the first capacitor C1 provided in the second region 200 and including a first lower electrode 142 and a first upper electrode 144a facing the first lower electrode 142, the first electrode 150 electrically connected to the first transistor M1 and provided in the first region 100, a pixel defining layer 120 provided in at least the first region 100 and including a first opening 120a exposing a part of the first electrode 150 and a second opening 120b corresponding to the second region 200, the second electrode 170 facing the first electrode 150, and an intermediate layer 160 disposed between the first electrode 150 and the second electrode 170 and including an organic emission layer 162. At least a part of the first capacitor C1 may overlap with at least a part of the second opening 120b along a direction perpendicular to the main surface 10a.

The pixel P2 included in the OLED display 1 may include the first region 100 emitting light having a certain color and the second region 200 through which external light is transmitted. A user may see, through the second region 200, an image outside the OLED display 1. That is, the OLED display 1 may be a transparent display.

A first subpixel SPr, a second subpixel SPg, and a third subpixel SPb, which emit different light colors, may be disposed in the first region 100. The first subpixel SPr, the second subpixel SPg, and the third subpixel SPb may respectively emit a red light, a green light, and a blue light. However, the described technology is not limited thereto, and any color combination may be used as long as white is realized.

Each of first subpixel SPr, the second subpixel SPg, and the third subpixel SPb may be driven by the pixel circuit PC of FIG. 2. According to an embodiment, at least a part of the pixel circuit PC may be disposed to in a plan view overlap with the first electrode 150 included in each of the first subpixel SPr, the second subpixel SPg, and the third subpixel SPb. Such a configuration may be a structure suitable for a type of display device in which the first electrode 150 is a reflective electrode and the second electrode 170 is a transparent or semitransparent electrode, i.e. the OLED display 1 that is a top emission type. At least a part of the pixel circuit PC may be disposed between the substrate 10 and the first electrode 150, and thus, a space occupied by the pixel circuit PC in the pixel P2 may be reduced, thereby enhancing an aperture ratio and a transmittance of the OLED display 1.

However, the described technology is not limited thereto. An OLED display according to another embodiment may be a bottom emission type where a first electrode is a transparent or semitransparent electrode and a second electrode is a reflective electrode. In this case, a pixel circuit may be disposed not to overlap with the first electrode such that emitted light is not refracted and/or reflected.

The OLED display 1 includes a plurality of pixels. Hereinafter, for convenience of description, four adjacent pixels among the pixels may be referred to as the first pixel P1, the second pixel P2, a third pixel P3, and a fourth pixel P4. FIG. 4 is a cross-sectional view of a part of the second pixel P2 of FIG. 3. The first pixel P1, the third pixel P3, and the fourth pixel P4 may have the same or similar structure as the second pixel P2.

The first pixel P1, the second pixel P2, the third pixel P3, and the fourth pixel P4 may be disposed along a first direction D1. One or more wirings may be disposed between the first pixel P1 and the second pixel P2 and between the third pixel P3 and the fourth pixel P4 and may extend along a second direction D2 crossing the first direction D1. The one or more wirings may be the scan lines SLi, the data lines DLj, and/or the power lines PL. According to an embodiment, the wirings extending along the second direction D2 may be the scan lines SLj but are not limited thereto. Reference numerals SLi−1, SLi, SLi+1, and SLi+2 of FIG. 3 may respectively denote scan lines corresponding to the first pixel P1, the second pixel P2, the third pixel P3, and the fourth pixel P4. Although not shown in FIG. 3, the data line DLj of FIG. 2 extending along the first direction D1 may be provided in the first region 100.

According to an embodiment, the wirings may extend along the second direction D2 only between the first pixel P1 and the second pixel P2 and between the third pixel P3 and the fourth pixel P4, and no wiring may extend between the second pixel P2 and the third pixel P3. That is, an opaque wiring identifying the second region 200 of the second pixel P2 and the second region 200 of the third pixel P3 may not be present, and thus the second region 200 of the second pixel P2 and the second region 200 of the third pixel P3 may be connected to each other along the first direction D1. In more detail, the second opening 120b included in the pixel defining layer 120 provided in the second pixel P2 may extend to the third pixel P3 adjacent to the second pixel P2.

According to an embodiment, a wiring may be disposed between the second pixel P2 and the first pixel P1 provided in one direction, no wiring may be disposed between the second pixel P2 and the third pixel P3 provided in another direction, and a wiring disposed between the second region 200 included in the second pixel P2 and the second region 200 included in the first pixel P1 adjacent to the second pixel P2 may be the scan line SLj requiring a relatively small number of wirings compared to the data line DLj, and thus an area and transmittance of the second region 200 of the OLED display 1 may be enhanced.

The second region 200 may be a transparent region where light incident on one surface of the substrate 10 from the environment passes through the OLED display 1 and is recognized by a user, and thus, a reflective electrode, an opaque wiring, etc. may not be disposed in the second region 200. The second region 200 may be divided by an opaque wiring or an opaque electrode. According to an embodiment, the second region 200 may be defined as a region between an opaque wiring and another opaque wiring spaced apart from the opaque wiring. However, the described technology is not limited thereto. When the pixel defining layer 120 includes a light-absorbing material, the second region 200 may be defined as a region where the second opening 120b included in the pixel defining layer 120 is formed.

The first capacitor C1 including the first lower electrode 142 and the first upper electrode 144a that include a transparent conductive material may be provided in the second region 200 of the OLED display 1. According to an embodiment, at least a part of the first capacitor C1 overlaps the second opening 120b included in the pixel defining layer 120 in a plan view such that the at least a part of the first capacitor C1 corresponds to the second region 200. The first lower electrode 142 of the first capacitor C1 may include polysilicon. The first upper electrode 144a of the first capacitor C1 may include transparent conductive oxide having transmittance higher than about 95%. Thus, although the first capacitor C1 is provided in the second region 200, external light incident on the OLED display 1 may pass through the second region 200.

A ratio of an area S1 of the second opening 120b included in the pixel defining layer 120 with respect to a total area of the second pixel P2 may be in a range from about 40% to about 90%. In this regard, the area S1 of the second opening 120b may be the area S1 of the second opening 120b corresponding to the second pixel P2.

When the area S1 of the second opening 120b is less than about 40%, a ratio of a region which is included in the OLED display 1 and is high in transmittance of external light may be lowered, and thus, it may be difficult for the OLED display 1 to function as a transparent display device. As the area S1 of the second opening 120b increases, the transmittance of the OLED display 1 may also increase. However, since it is required to secure the first region 100 displaying an image, the area S1 of the second opening 120b occupied in the second pixel P2 may not exceed about 90%. However, depending on the embodiment, the total area of the second pixel P2 may be greater than about 90% or less than about 40%.

According to an embodiment, a ratio of an area S2r+S2g+S2b of a region overlapping the second opening 120b of the first capacitor C1 with respect to the area S1 of the second opening 120b included in the second pixel P2 may be in a range from about 3% to about 9%. Reference numerals C1r, C1g, and C1b of FIG. 3 may respectively denote the first capacitors C1 disposed in the first subpixel SPr, the second subpixel SPg, and the third subpixel SPb. Reference numerals S2r, S2g, and S2b of FIG. 3 may respectively denote areas of regions overlapping the second opening 120b in the first capacitors C1r, C1g, and C1b.

When the ratio of the area S2r+S2g+S2b is less than about 3%, the capacity of the first capacitor C1 may be extremely reduced. When the ratio of an area S2r+S2g+S2b exceeds about 9%, the transmittance of the OLED display 1 may be reduced.

The first capacitor C1, along with the third transistor M3 of FIG. 2, may compensate for the threshold voltage Vth of the first transistor M1, and thus the first capacitor C1 does not need a greater capacity than the second capacitor C2 functioning as a storage capacitor. Nevertheless, the first capacitor C1 may need to maintain a voltage uniform for a certain time period in order to compensate for the threshold voltage Vth, thereby needing to have a certain degree of capacity.

A ratio of an area S2 of a region in which the first capacitor C1 and the second opening 120b overlap each other may need to secure an appropriate capacity of the first capacitor C1 and transmittance of the second region 200 within the above range.

According to an embodiment, the first lower electrode 142 of the first capacitor C1 may be electrically connected to a gate electrode of the first transistor M1 and a drain electrode of the third transistor M3 of FIG. 2. The first upper electrode 144a of the first capacitor C1 may be electrically connected to a second lower electrode 134 of the second capacitor C2 and a drain electrode of the second transistor M2 of FIG. 2. However, the described technology is not limited thereto. The first capacitor C1 may have various connection relationships with circuit devices according to a configuration of the pixel circuit PC.

A cross-sectional structure of the OLED display 1 will now be described according to a stack order with reference to FIG. 4 below.

Referring to FIG. 4, a buffer layer 111 may be provided over the substrate 10. The substrate 10 may be formed of glass, plastic, etc. The buffer layer 111 may have a single layer structure or a double layer structure including an inorganic material such as silicon nitride ($SiN_x$) and/or silicon oxide ($SiO_2$). The buffer layer 111 may prevent impurities from penetrating into the pixel circuit PC and planarize a surface of the substrate 10.

The first transistor M1 and the second capacitor C2 may be provided in the first region 100 over the buffer layer 111. The first capacitor C1 may be provided in the second region 200.

The first transistor M1 may include an active layer 122 disposed over the buffer layer 111 and a gate electrode 124 insulated from the active layer 122. The active layer 122 may include a channel region 122C, and a source region 122S and a drain region 122D which are separate from each other with the channel region 122C therebetween. A gate insulating layer 113 may be disposed between the active layer 122 and the gate electrode 124. The gate insulating layer 113 may extend from the first region 100 to the second region 200. The gate insulating layer 113 may be a dielectric layer disposed between the first lower electrode 142 and the first upper electrode 144a of the first capacitor C1.

The active layer 122 may include various materials. According to an embodiment, the active layer 122 may include polysilicon. The source region 122S and drain region 122D of the active layer 122 may include polysilicon doped with impurities. The doped source region 122S and drain region 122D may have conductivity.

The gate electrode 124 may include a lower gate electrode 124a and an upper gate electrode 124b provided on the lower gate electrode 124a. The upper gate electrode 124b may have a single layer structure or a multi-layer structure and may include an opaque conductive material.

The upper gate electrode 124b may have a single layer structure or a multi-layer structure including one or more materials among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The lower gate electrode 124a may include indium tin oxide (ITO) having a thickness in a range from about 100 Å to about 500 Å. The upper gate electrode 124b may have a single layer including molybdenum (Mo) or a triple layer structure including Mo/Al/Mo.

The lower gate electrode 124a and the upper gate electrode 124b may be formed through a single mask process. An upper surface of the lower gate electrode 124a may be in contact with the upper gate electrode 124b. A width GW1 of the upper surface of the lower gate electrode 124a may be less than a width GW2 of a lower surface of the upper gate electrode 124b. This will be described later.

The first capacitor C1 may be provided in the second region 200 over the buffer layer 111. The first capacitor C1 may include the first lower electrode 142 and the first upper electrode 144a. The first lower electrode 142 may be provided at the same layer as the active layer 122 and may include the same material as the source region 122S and the drain region 122D of the active layer 122. That is, the first lower electrode 142 may include doped polysilicon having conductivity.

The first upper electrode 144a may be provided at the same layer as the lower gate electrode 124a of the first transistor M1 and may include the same material as the lower gate electrode 124a. A thickness t of the first upper electrode 144a may be the same as that of the lower gate electrode 124a. The first upper electrode 144a may include ITO having the thickness t in a range from about 100 Å to about 500 Å.

When the thickness t of the first upper electrode 144a exceeds about 500 Å, transmittance of the second region 200 may deteriorate. When the thickness t of the first upper electrode 144a is less than 100 Å, since the first upper electrode 144a may be too thin, it may be difficult to form the first upper electrode 144a.

Both the first lower electrode 142 and the first upper electrode 144a may include a transparent conductive material, and thus external light incident on the OLED display 1 may not be blocked but may be transmitted although the first capacitor C1 is disposed in the second region 200. However, although the transmittance of the second region 200 may be reduced by the first capacitor C1, since the first capacitor C1 occupies a small area in the second region 200, a reduction degree of transmittance may be very small.

Referring to FIG. 2, the first upper electrode 144a of the first capacitor C1 may be electrically connected to the gate electrode 124 of the first transistor M1 but the described technology not limited thereto.

An interlayer insulating layer 117 covering the gate electrode 124 may be provided over the gate insulating layer 113. The interlayer insulating layer 117 may have a single layer structure or a double layer structure including an inorganic material such as silicon nitride ($SiN_x$) and/or silicon oxide ($SiO_2$). The interlayer insulating layer 117 may include a third opening 117a corresponding to at least the second region 200.

A source electrode 128S and a drain electrode 128D of the first transistor M1 may be provided over the interlayer insulating layer 117. The source electrode 128S and the drain electrode 128D may be respectively connected to the source electrode 122S and the drain electrode 122D of the active layer 122.

The source electrode 128S and the drain electrode 128D may have a single layer structure or a multi-layer structure including one or more materials among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). According to an embodiment, the source electrode 128S and the drain electrode 128D may have a triple layer structure including Mo/Al/Mo or Ti/Al/Ti.

The second capacitor C2 may be further disposed in the first region 100 over the buffer layer 111, in addition to the first transistor M1. The second capacitor C2 may include the second lower electrode 134 and a second upper electrode 138. The second lower electrode 134 may be provided at the same layer and may include the same material as the gate electrode 124 of the first transistor M1. The second upper electrode 138 may be provided at the same layer and may include the same material as the source electrode 128S and the drain electrode 128D of the first transistor M1.

The second lower electrode 134 may include a lower layer 134a and an upper layer 134b like the gate electrode 124. The lower layer 134a may include the same material as the lower gate electrode 124a. The upper layer 134b may include the same material as the upper gate electrode 124b.

Referring to FIG. 2, the second capacitor C2 may function as a storage capacitor of the pixel circuit PC and may be electrically connected to the first lower electrode 142 of the first capacitor C1 but the described technology is not limited thereto.

A via insulating layer 119 covering the source electrode 128S, the drain electrode 128D, and the second upper electrode 138 may be disposed over the interlayer insulating layer 117, and may include an organic material to planarize a step difference due to the pixel circuit PC of FIG. 2. The via insulating layer 119 may include a fourth opening 119a corresponding to the second region 200.

At least a part of the first upper electrode 144a may be exposed by the third opening 117a included in the interlayer insulating layer 117 and the fourth opening 119a included in the via insulating layer 119. According to an embodiment, an area of the third opening 117a may be greater than an area of the fourth opening 119a, and the via insulating layer 119 may be in direct contact with a part of an upper surface of the first upper electrode 144a exposed by the third opening 117a. That is, the via insulating layer 119 may cover an edge region of the first upper electrode 144a, and a region of the first upper electrode 144a, excluding the edge region covered by the via insulating layer 119, may be exposed by the fourth opening 119a.

The via insulating layer 119 may include an organic material and may not have a high adhesive force with the interlayer insulating layer 117 including an inorganic material. Thus, when a region surrounding the fourth opening 119a of the via insulating layer 119 is in direct contact with the interlayer insulating layer 117, a problem in which the via insulating layer 119 is separated from the interlayer insulating layer 117 may occur. However, according to an embodiment, the first upper electrode 144a including transparent conductive oxide having a high adhesive force with a material constituting the via insulating layer 119 may be disposed between the interlayer insulating layer 117 and the via insulating layer 119, thereby preventing the via insulating layer 119 from being separated from the interlayer insulating layer 117.

The OLED that includes the first electrode 150, the second electrode 170 facing the first electrode 150, and the intermediate layer 160 disposed between the first electrode 150 and the second electrode 170 and including the organic emission layer 162 may be disposed in the first region 100 over the via insulating layer 119. The first electrode 150 may be electrically connected to the drain electrode 128D of the first transistor M1 through a via hole VIA in the via insulating layer 119.

Both edges of the first electrode 150 may be covered by the pixel defining layer 120. The pixel defining layer 120 may include the first opening 120a exposing a part of the first electrode 150 and the second opening 120b corresponding to the second region 200.

According to an embodiment, an area of the second opening 120b of the pixel defining layer 120 may be greater than an area of the fourth opening 119a included in the via insulating layer 119 and may be provided only over an upper portion of the via insulating layer 119. However, the described technology is not limited thereto. According to another embodiment, the area of the second opening 120b may be less than the area of the fourth opening 119a. In this case, the pixel defining layer 120 may extend to one region of the upper surface of the first upper electrode 144a along an etching surface of the fourth opening 119a.

At least a part of the first capacitor C1 may overlap with the second opening 120b along a direction perpendicular to the main surface 10a. That is, the at least a part of the first capacitor C1 may be provided inside the second opening 120b, and thus the upper surface of the first upper electrode 144a may be exposed by the second opening 120b.

The first electrode 150 may be configured as a reflective electrode and may include a reflective layer including Ag, Mg, Al, Pt, Pd, Au, Ni, Nd, Ir, Cr, and a compound thereof, and a transparent or semitransparent electrode layer formed on the reflective layer. The first electrode 150 may be formed as an island shape independently for each subpixel.

The second electrode 170 may be configured as a transparent or semitransparent electrode, may include one or more materials selected from among Ag, Al, Mg, Li, Ca, Cu, LiF/Ca, LiF/Al, MgAg, and CaAg, and may be formed as a thin film having a thickness in a range from several nm to several tens nm. The second electrode 170 may be electrically connected to all pixels included in the OLED display 1.

The intermediate layer 160 including the organic emission layer 162 may be disposed between the first electrode 150 and the second electrode 170. A common layer that is common in all the pixels may be disposed between the first electrode 150 and the organic emission layer 162 and between the organic emission layer 162 and the second electrode 170. According to an embodiment, a first common layer 161 may be disposed between the first electrode 150 and the organic emission layer 162 and may include a hole injection layer (HIL) and/or a hole transport layer (HTL). A second common layer 163 may be disposed between the organic emission layer 162 and the second electrode 170 and may include an electron transport layer (ETL) and/or an electron injection layer (EIL).

The first common layer 161, the second common layer 163, and the second electrode 170 may be disposed in the first region 100 and the second region 200. The first common layer 161, the second common layer 163, and the second electrode 170 may be layers that are common in all the pixels included in the OLED display 1 and may be disposed in all regions of the OLED display 1 owing to a high transmittance. However, the described technology is not limited thereto. That is, according to another embodiment, the second region 170 includes an opening corresponding to the second region 200. This will be described later.

The organic emission layer 162 may emit a red light, a green light, or a blue light. However, the described technology is not limited thereto. As long as a white light is realized by a combination of other colors, a combination of colors in addition to red, green, and blue may be possible.

The OLED display 1 according to an embodiment may be a top emission type where an image is realized in a direction toward the second electrode 170, and at least a part of the pixel circuit PC may be disposed between the substrate 10 and the first electrode 150.

Referring to FIG. 3, one or more wirings may be disposed between the first pixel P1 and the second pixel P2 and between the third pixel P3 and the fourth pixel P4 and may extend along the second direction D2 crossing the first direction D1, and may be the scan lines SLi.

The scan line SLi is provided at the same layer and may include the same material as the gate electrode 124 of the first transistor M1. However, the described technology is not limited thereto. According to another embodiment, an additional conductive pattern between the gate electrode 124 of the first transistor M1 and the source electrode 128S and between the gate electrode 124 and the drain electrode 128D and an additional insulating layer over the additional conductive pattern and/or under the addition conductive pattern may be further disposed. The scan line SLi may be provided at the same layer and may include the same material as the additional conductive pattern.

The scan line SLi may have a triple layer structure of Mo/Al/Mo for implementing a low resistance but the described technology is not limited thereto. The scan line SLi may include a region that is to include molybedenum (Mo).

The OLED display 1 may include the first capacitor C1 including a transparent material and provided in the second region 200, thereby securing a space in which the pixel circuit PC is to be provided while not reducing an area of the second region 200. The first capacitor C1 may be provided not to overlap with the transistors M1 through M3 or the second capacitor C2 in a plan view, thereby preventing defects such as short circuit due to a step difference caused by lower impurities and that easily occurs when many layers are stacked.

FIGS. 5A to 5K are cross-sectional views for sequentially describing a method of manufacturing the OLED display 1 of FIG. 4.

Figure 5A:
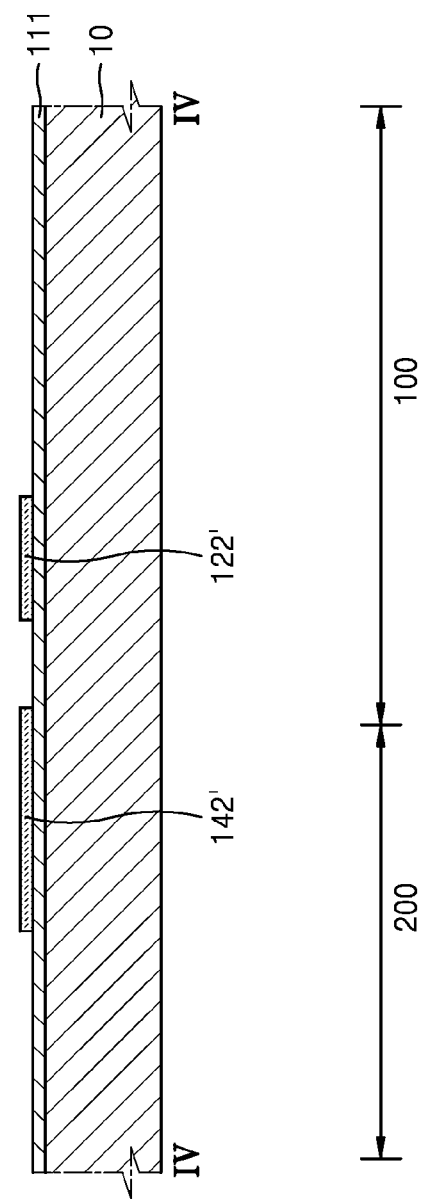
FIGS. 5A to 5K are cross-sectional views for sequentially describing a method of manufacturing the OLED display of FIG. 4.

Referring to FIG. 5A, the substrate 10 including the first region 100 realizing an image and the second region 200 through which external light is transmitted may be prepared, and then, a first semiconductor pattern 122' and a second semiconductor pattern 142' may be respectively formed over the first region 100 and the second region 200 of the substrate 10. An operation of forming the buffer layer 111 over the substrate 10 may be further performed before the first semiconductor pattern 122' and the second semiconductor pattern 142' are formed.

The first semiconductor pattern 122' and the second semiconductor pattern 142' may be formed by forming and patterning a semiconductor material over an entire surface of the substrate 10. According to an embodiment, the semiconductor material may be polysilicon. Polysilicon may be formed by coating amorphous silicon over the substrate 10 and irradiating a laser or the like onto the amorphous silicon to crystallize the amorphous silicon.

Figure 5B:
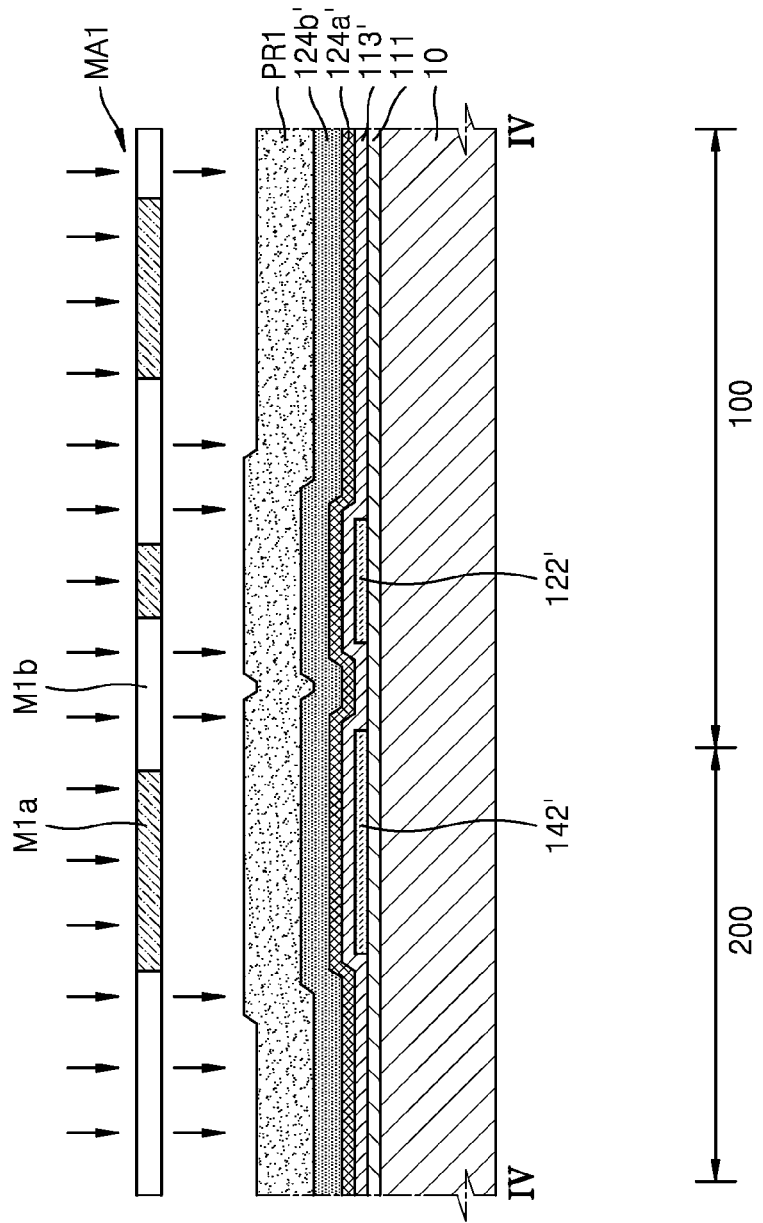

Referring to FIG. 5B, a first insulating material 113' may be formed over the substrate 10 to cover the first semiconductor pattern 122' and the second semiconductor pattern 142', and then, a transparent conductive oxide 124a', a first conductive material 124b', and a first photoresist PR1 may be sequentially formed on the first insulating material 113'. Light may be irradiated onto the first photoresist PR1 by using a first mask MA1 including a light blocking unit M1a blocking the light and a light transmitting unit M1b transmitting the light.

The transparent conductive oxide 124a' may include ITO having a thickness in a range from about 100 Å to about 500 Å, and the first conductive material 124b' may be a single layer including molybdenum (Mo) or have a triple layer structure including Mo/Al/Mo. The first photoresist PR1 may be a positive photoresist in which a region onto which light is irradiated is solved by a developing solution.

Figure 5C:
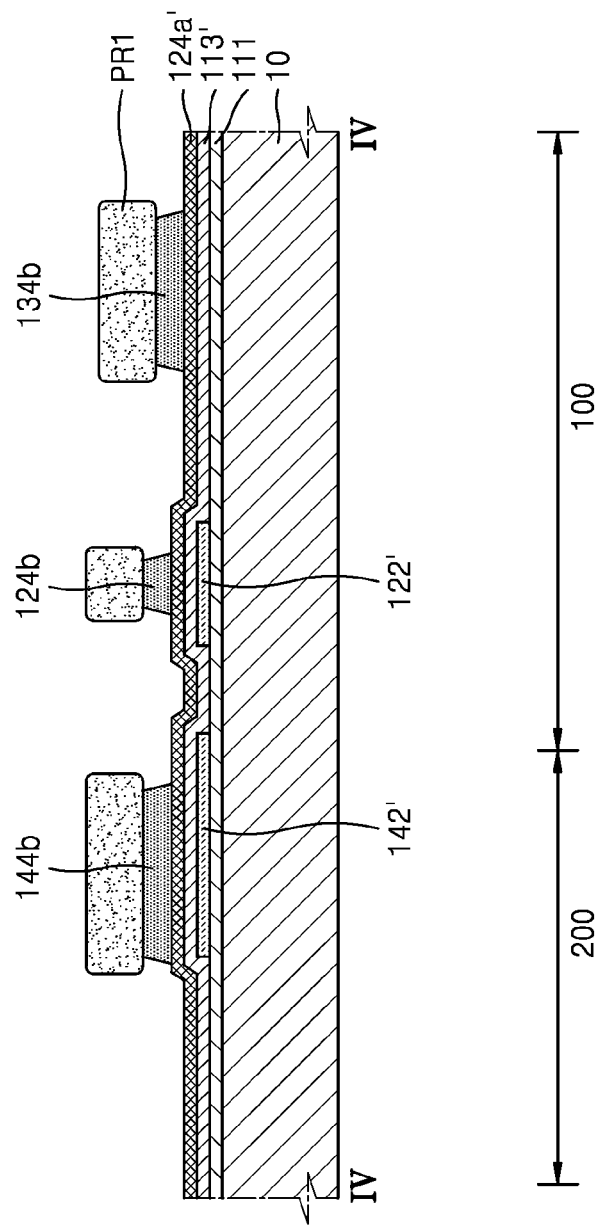
Figure 5D:
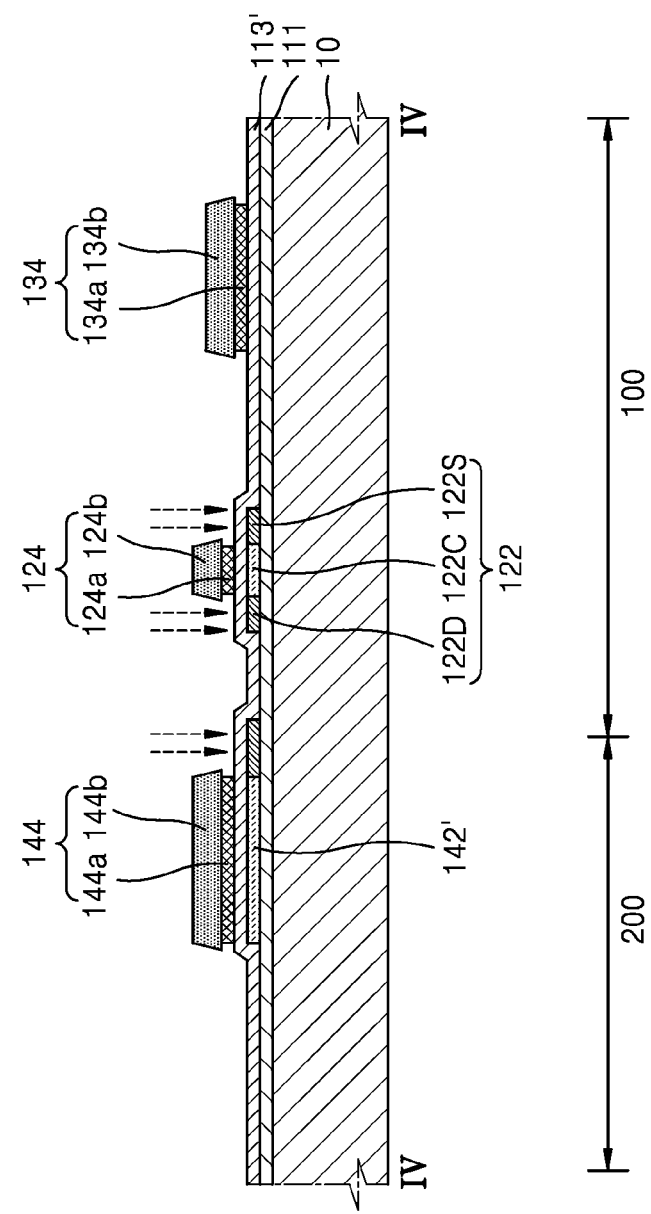

Referring to FIGS. 5C and 5D, after the region of the first photoresist PR1 to which the light is irradiated is removed, the first conductive material 124b' may be wet etched by using a first etching solution. After the first conductive material 124b' is wet etched, the transparent conductive oxide 124a' may be wet etched by using a second etching solution.

The first conductive material 124b' and the transparent conductive oxide 124a' may have different etching selectivity. The transparent conductive oxide 124a' may not be solved with respect to the first etching solution for etching the first conductive material 124b'. Thus, after the first conductive material 124b' is completely etched, the transparent conductive oxide 124a' may be etched by using the second etching solution different from the first etching solution. During this process, not only a region of the transparent conductive oxide 124a' in which the first conductive material 124b' is not provided but also a lower region of an edge of the patterned first conductive material 124b' may be etched.

By the above process, the gate electrode 124 including the lower gate electrode 124a and the upper gate electrode 124b may be formed over the first semiconductor pattern 122'. The width GW1 of FIG. 4 of an upper surface of the lower gate electrode 124a may be less than the width GW2 of FIG. 4 of the lower surface of the upper gate electrode 124b contacting the upper surface of the lower gate electrode 124a.

A conductive pattern 144 facing the second semiconductor pattern 142' formed in the second region 200 of the substrate 10 and including the first upper electrode 144a and an upper conductive layer 144b provided on the first upper electrode 144a may be formed over the second semiconductor pattern 142'.

By the above process, the second lower electrode 134 of the second capacitor C2 may be formed in the first region 100 of the substrate 10. The second lower electrode 134 may include the lower layer 134a and the upper layer 134b formed by using the same processes performed over the lower gate electrode 124a and the upper gate electrode 124b respectively.

After the gate electrode 124, the second lower electrode 134, and the conductive pattern 144 are formed, a part of the first semiconductor pattern 122' may be doped with impurities by using the gate electrode 124 as a mask, thereby forming the active layer 122 of the first transistor M1. The active layer 122 may include the source region 122S and the drain region 122D that are doped with impurities and the channel region 122C that is not doped with impurities.

The second semiconductor pattern 142' may include a region that is not covered by the conductive pattern 144. A part of the second semiconductor pattern 142' may be doped with impurities by a doping process described above.

Figure 5E:
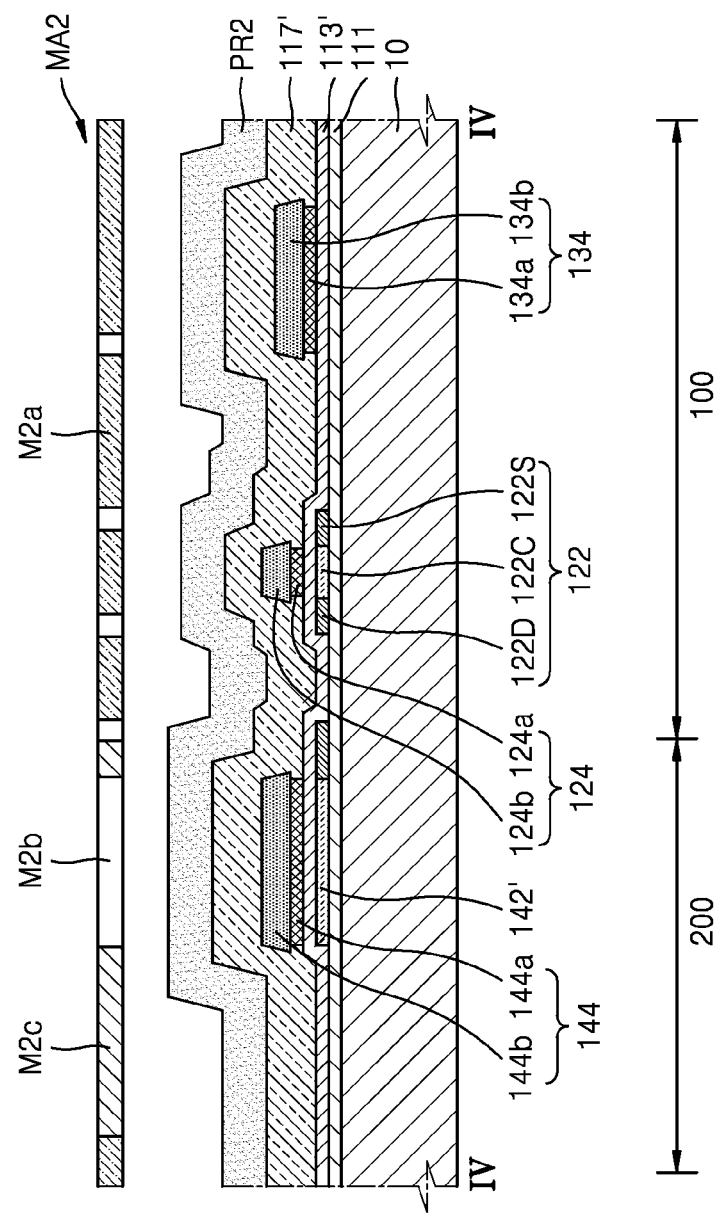
Figure 5F:
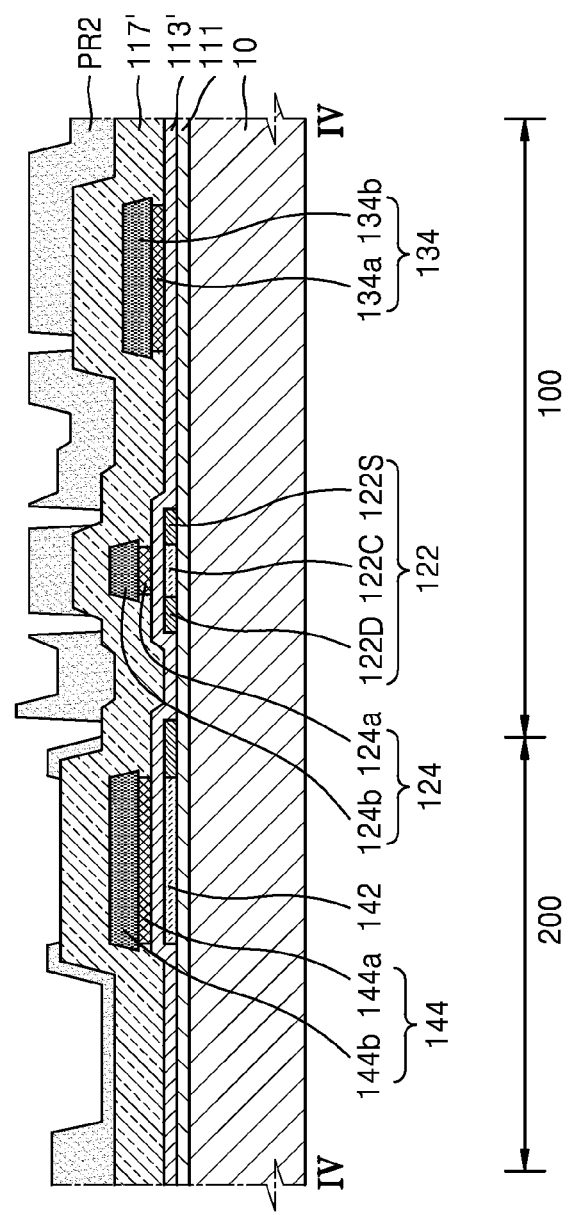

Referring to FIGS. 5E and 5F, a second insulating material 117' and a second photoresist PR2 may be formed over the first insulating material 113' to cover the gate electrode 124, the second lower electrode 134, and the conductive pattern 144.

After the second photoresist PR2 is formed, light may be irradiated onto the second photoresist PR by using a second mask MA2 including a light blocking unit M2a blocking the light, a light transmitting unit M2b transmitting the light, and a semi-light transmitting unit M2c transmitting a part of the light.

The second mask MA2 may be a halftone mask including the semi-light transmitting unit M2c. The second photoresist PR2, to which the light transmitting the semi-light transmitting unit M2c is irradiated, may be partially removed by using a developing solution and partially remain.

Figure 5G:
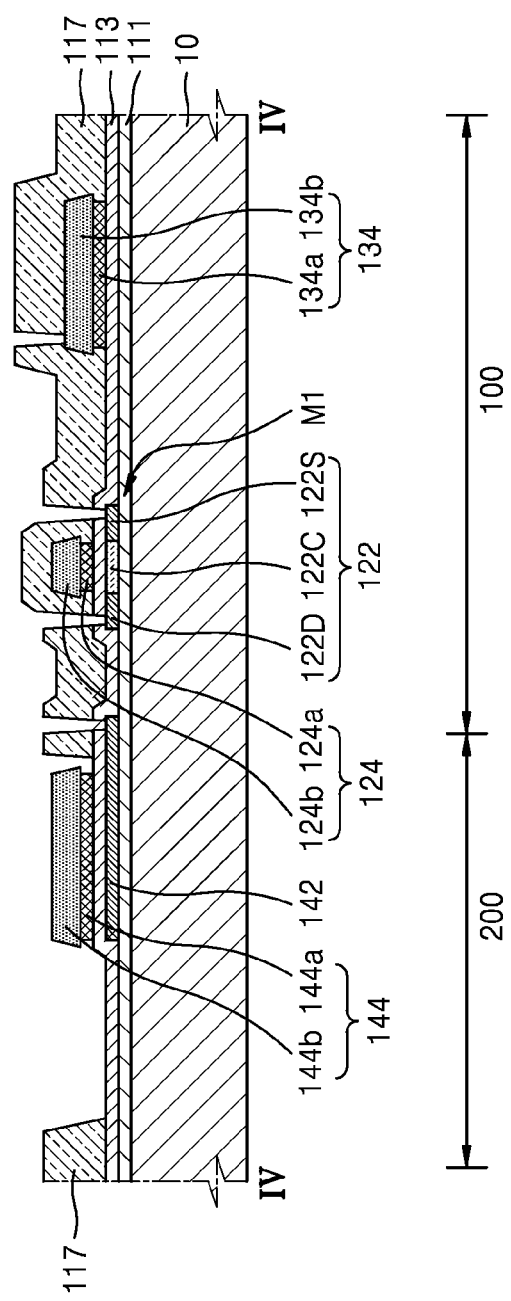

Referring to FIG. 5G, the second insulating material 117' exposed after the second photoresist PR2 is developed and the first insulating material 113' provided in a lower portion of the second insulating material 117' may be etched, thereby forming the gate insulating layer 113 and the interlayer insulating layer 117. The interlayer insulating layer 117 may include the third opening 117a corresponding to at least the second region 200.

A remaining part of the second photoresist PR2 to which the light is irradiated by the semi-light transmitting unit M2c of the second mask MA2 may correspond to a peripheral portion of the first capacitor C1. A thickness of the remaining second photoresist PR2 may be substantially the same as a thickness of the first insulating material 113'. That is, during a dry etching process of removing the first insulating material 113' and the second insulating material 117' to expose the source region 122S and the drain region 122D of the active layer 122, only the second insulating layer 117' may be removed from the remaining part of the second photoresist PR2. That is, the first insulating material 113' provided in the peripheral portion of the first capacitor C1 may not be removed during the dry etching process.

Figure 5H:
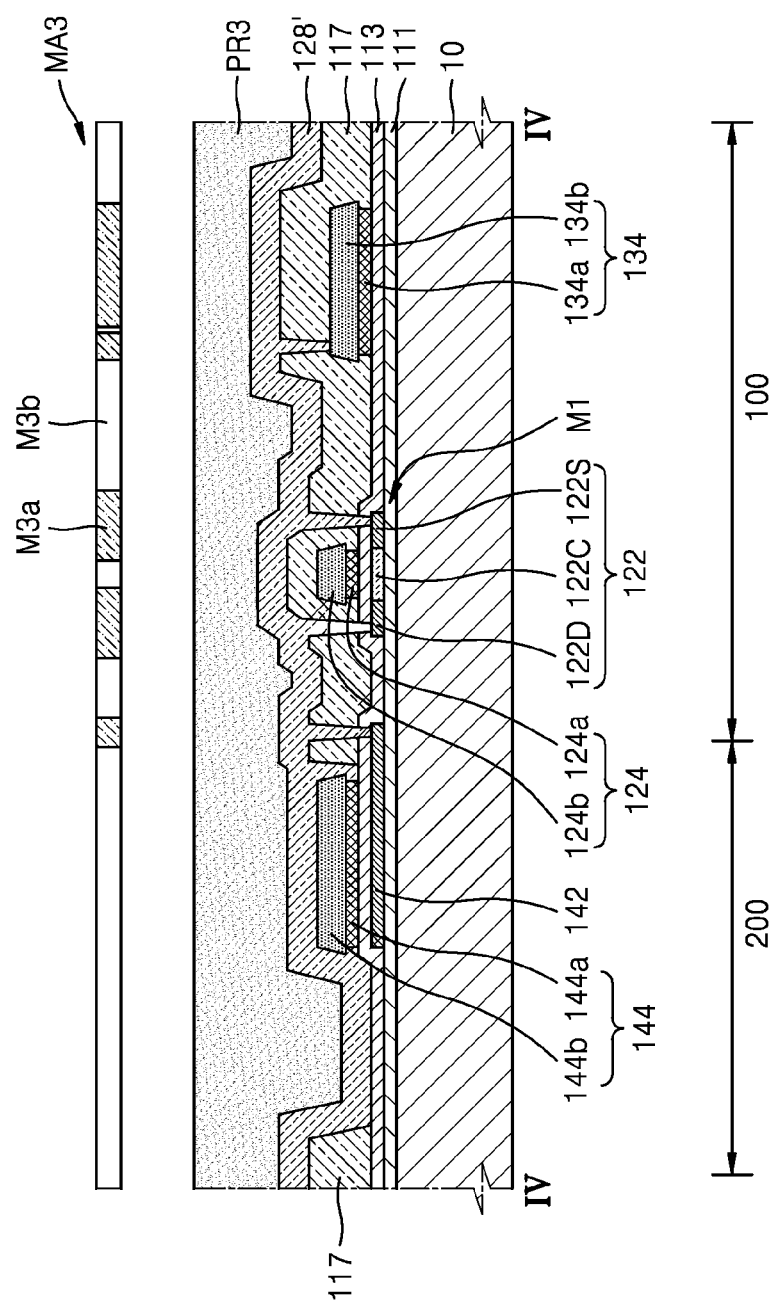

Referring to FIG. 5H, a second conductive material 128' and a third photoresist PR3 may be formed over the gate insulating layer 113 and the interlayer insulating layer 117. According to an embodiment, the second conductive material 128' may have a triple layer structure of Mo/Al/Mo or Ti/Al/Ti.

After the third photoresist PR3 is formed, light may be irradiated onto the third photoresist PR3 by using a third mask MA3 including a light blocking unit M3a blocking the light and a light transmitting unit M3b transmitting the light.

Figure 5I:
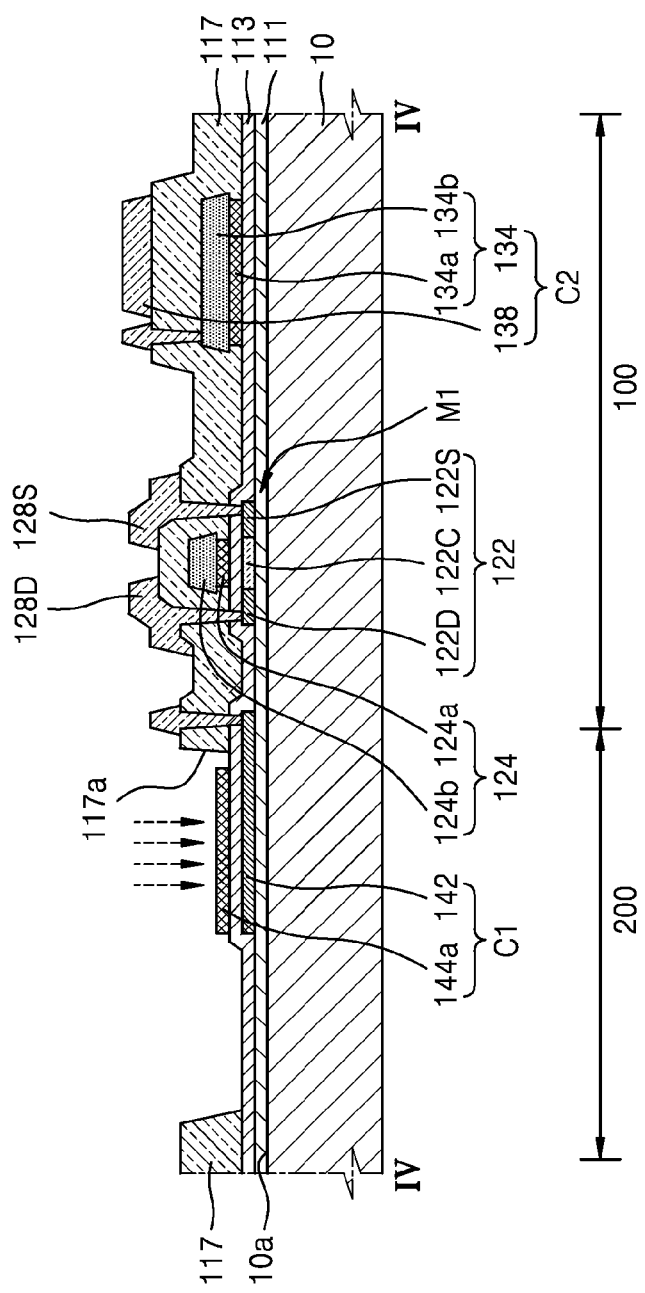

Referring to FIG. 5I, after the third photoresist PR 3 is formed, the source electrode 128S and the drain electrode 128D of the first transistor M1 and the second upper electrode 138 of the second capacitor C2 may be formed by etching the second conductive material 128'. During a process of etching the second conductive material 128', the upper conductive layer 144b of the conductive pattern 144 provided over a lower portion of the second conductive material 128' may be also etched.

The first upper electrode 144a including transparent conductive oxide of the conductive pattern 144 may be crystallized by heat applied during a process of annealing the active layer 122 after doping impurities of FIG. 5D, and thus the first upper electrode 144a may not be etched when the upper conductive layer 144b of the conductive pattern 144 is etched.

After the upper conductive layer 144b of the conductive pattern 144 is etched, the second semiconductor pattern 142' may be doped with impurities, thereby forming the first lower electrode 142 of the first capacitor C1. The gate insulating layer 113 having a thickness of about 100 Å and the first upper electrode 144a having a thickness in a range from about 100 Å to about 500 Å may be disposed over the second semiconductor pattern 142'. The gate insulating layer 113 and the first upper electrode 144a may not block impurities, and thus the second semiconductor pattern 142' may be doped with impurities.

Figure 5J:
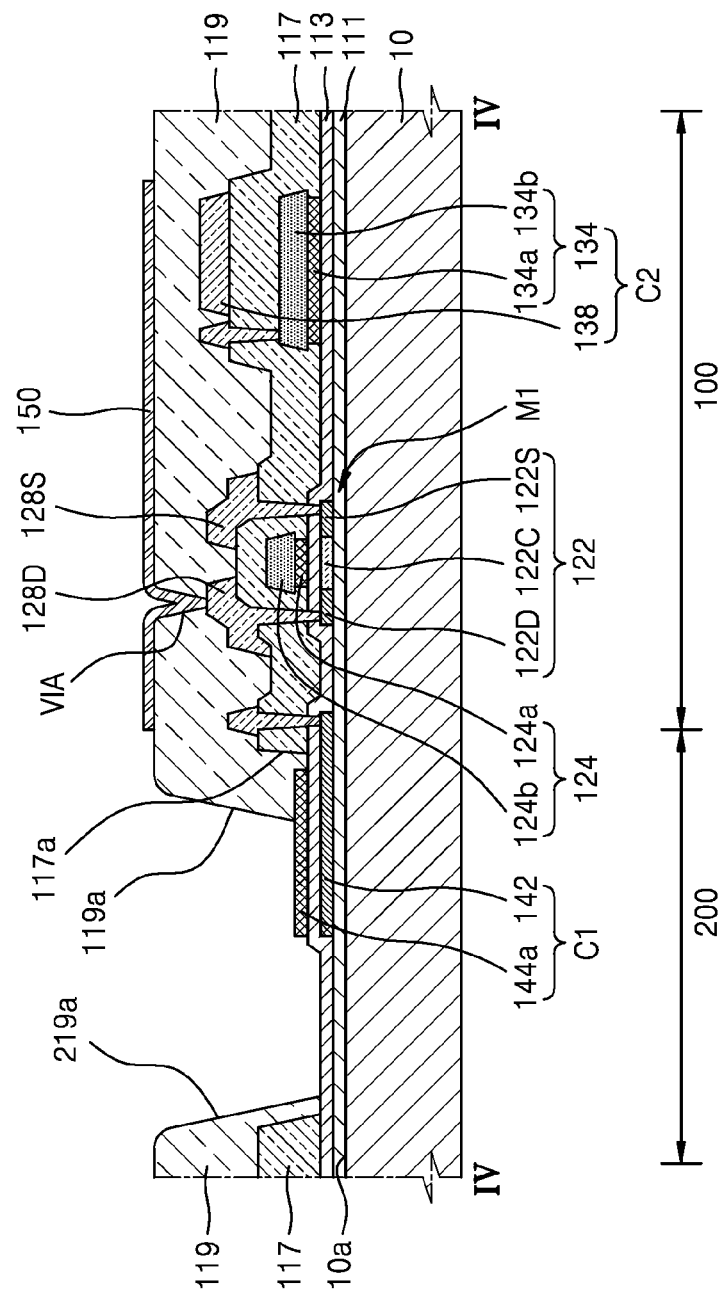

Referring to FIG. 5J, a first organic insulating material (not shown) covering the first transistor M1 and the second capacitor C2 may be formed on the interlayer insulating layer 117 and then patterned, and thus the via insulating layer 119 including the via hole VIA and the fourth opening 119a corresponding to the second region 200 may be formed.

One region of the via insulating layer 119 may be provided on an edge region of the first capacitor C1. A part of an upper surface of the first capacitor C1 may be exposed by the fourth opening 119a included in the via insulating layer 119.

Figure 5K:
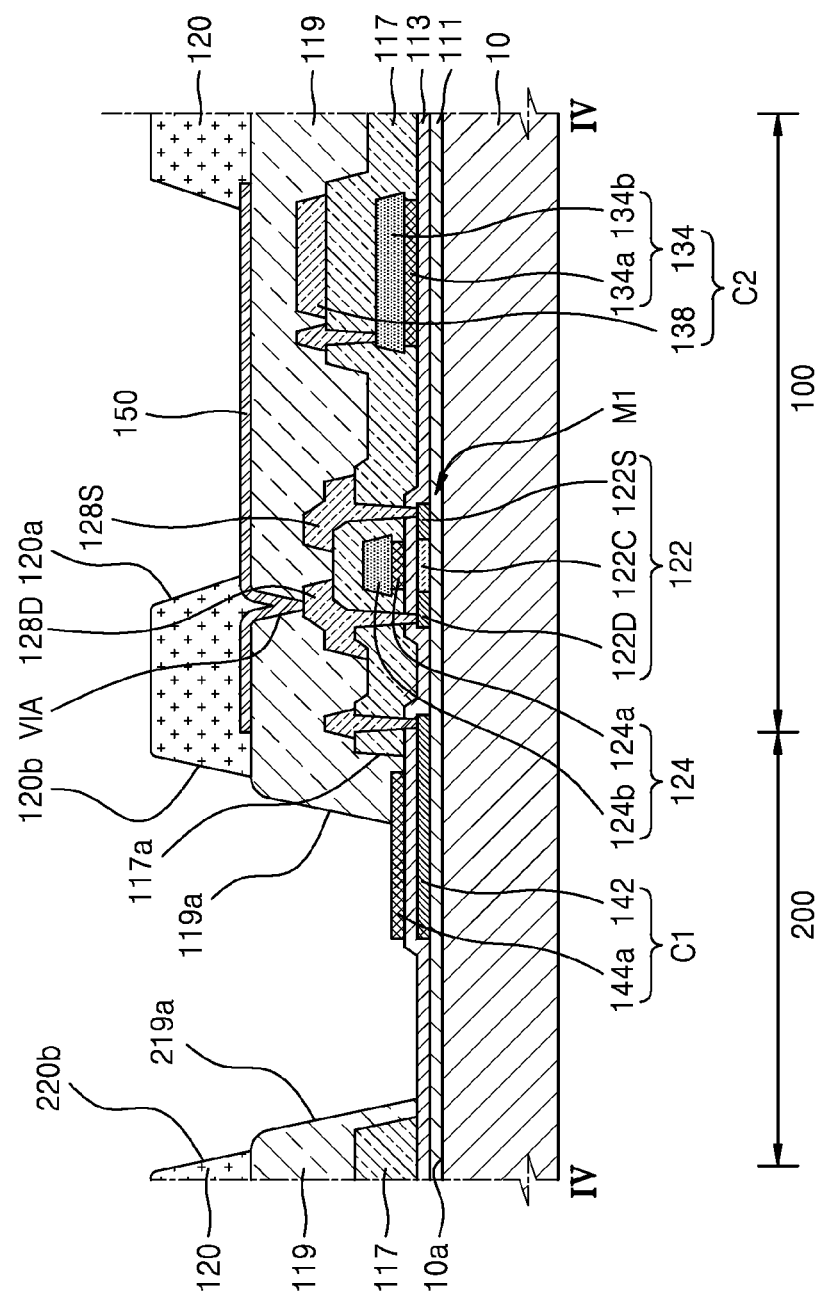

Referring to FIG. 5K, the first electrode 150 may be formed in the first region 100 over the via insulating layer 119, a second organic insulating material (not shown) may be formed on the first electrode 150 and then patterned, and thus the pixel defining layer 120 including the first opening 120a exposing a part of the first electrode 150 and the second opening 120b corresponding to the second region 200 may be formed.

Referring to FIG. 4, the intermediate layer 160 and the second electrode 170 may be formed over the first electrode 150, the pixel defining layer 120, and the first upper electrode 144a of the first capacitor C1 that is exposed by the second opening 120b and the fourth opening 119a.

The method of manufacturing the OLED display 1 may simultaneously or concurrently perform a process of forming the second capacitor C2 in the second region and a process of forming the first transistor M1 and may not require a separate mask. That is, the second capacitor C2 may be easily formed in the second region 200 without adding the mask.

Figure 6:
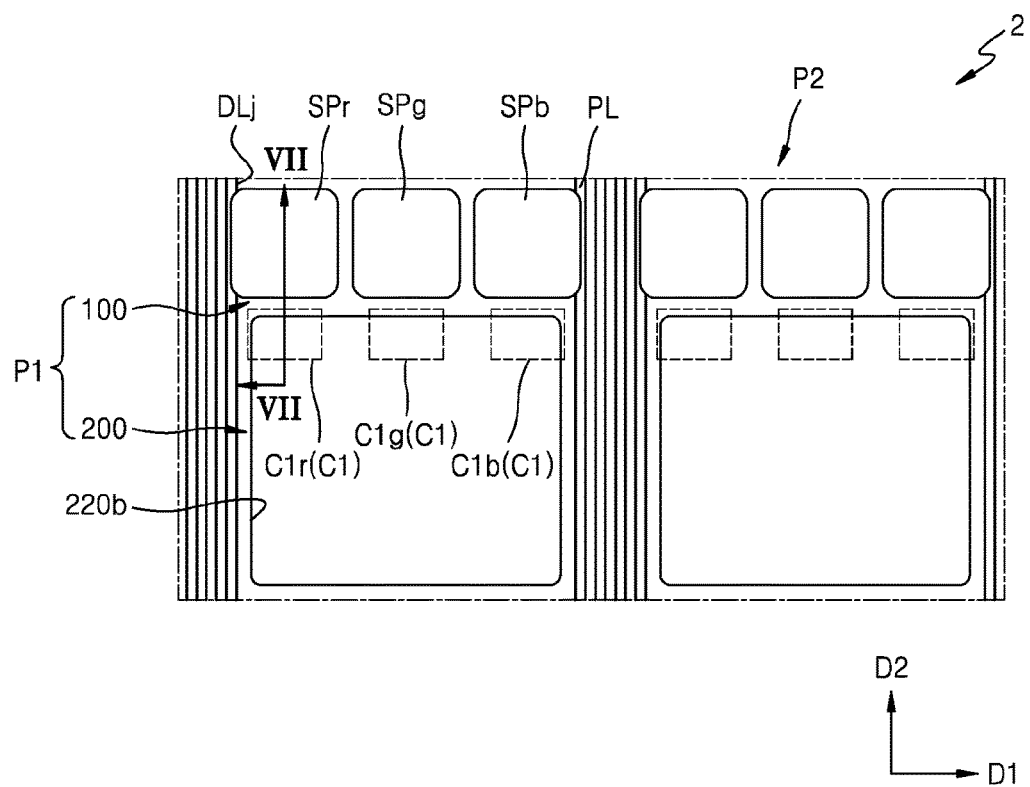
FIG. 6 is a plan view schematically illustrating a plurality of pixels included in an OLED display according to another embodiment.
Figure 7:
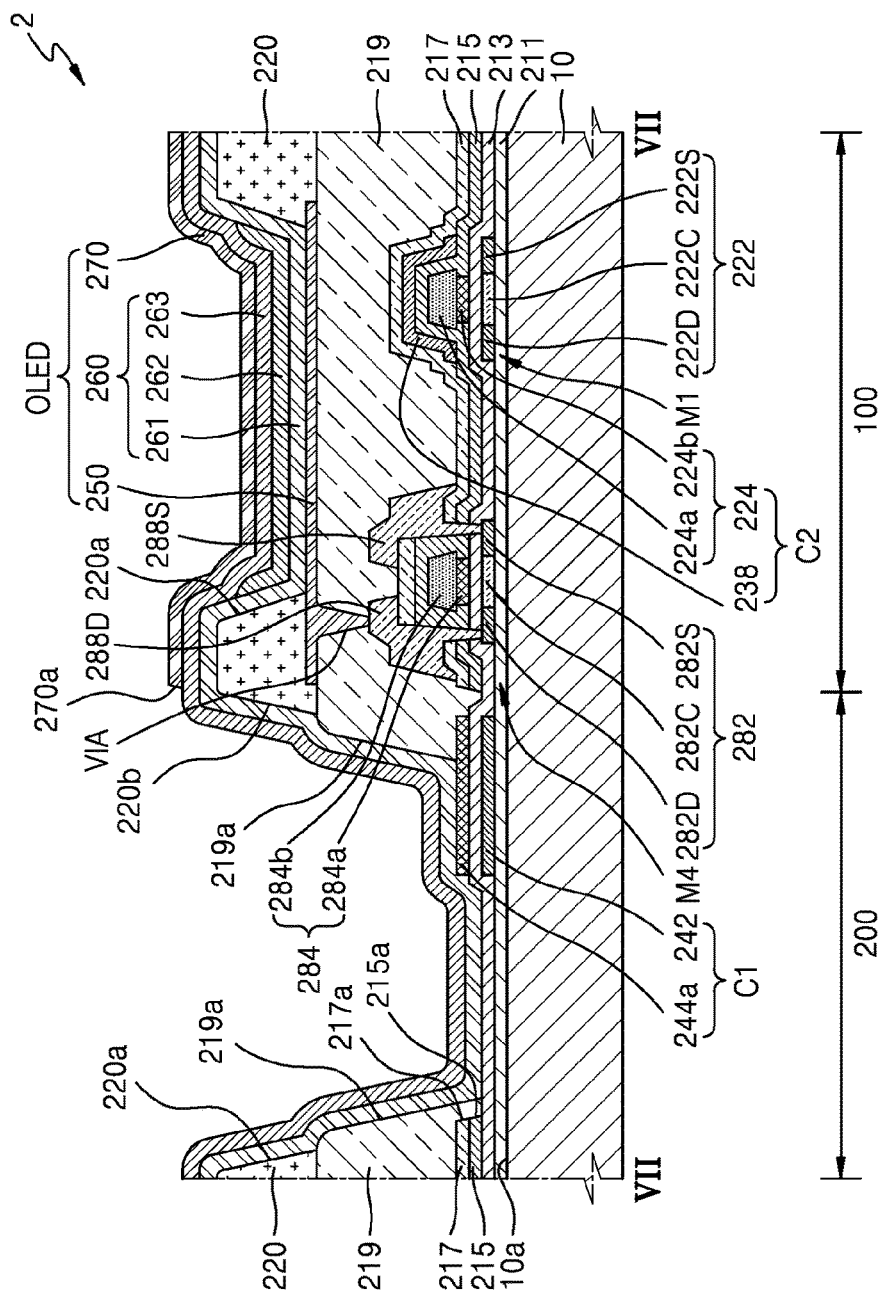
FIG. 7 is a cross-sectional view taken along line VII-VII of FIG. 6.

FIG. 6 is a plan view schematically illustrating a plurality of pixels included in an OLED display 2 according to another embodiment. FIG. 7 is a cross-sectional view taken along line VII-VII of FIG. 6.

Referring to FIGS. 6 and 7, the OLED display 2 according to an embodiment may include the substrate 10 including the main surface 10a and the pixel P1 disposed on the main surface 10a of the substrate 10 and includes the first region 100 configured to display an image and the second region 200 through which external light is transmitted. The pixel P1 may include the first transistor M1 provided in the first region 100, the first capacitor C1 provided in the second region 200 and including a first lower electrode 242 and a first upper electrode 244a facing the first lower electrode 242, a first electrode 250 electrically connected to the first transistor M1 and provided in the first region 100, a pixel defining layer 220 provided in at least the first region 100 and including a first opening 220a exposing a part of the first electrode 150 and a second opening 220b corresponding to the second region 200, the second electrode 270 facing the first electrode 250, and an intermediate layer 260 disposed between the first electrode 250 and the second electrode 270 and including an organic emission layer 262. At least a part of the first capacitor C1 may overlap with at least a part of the second opening 220b along a direction substantially perpendicular to the main surface 10a.

The pixel P1 included in the OLED display 2 may include the first region 100 emitting light having a certain color and the second region 200 through which external light is transmitted. A user may see, through the second region 200, an image outside the OLED display 2.

The first subpixel SPr, the second subpixel SPg, and the third subpixel SPb, which emit different light colors, may be disposed in the first region 100. The first subpixel SPr, the second subpixel SPg, and the third subpixel SPb may respectively emit a red light, a green light, and a blue light. However, the described technology is not limited thereto, and any color combination may be used as long as white is realized.

Each of first subpixel SPr, the second subpixel SPg, and the third subpixel SPb may be driven by the pixel circuit PC of various forms. According to an embodiment, at least a part of the pixel circuit PC may be disposed to in a plan view overlap with the first electrode 250 included in each of the first subpixel SPr, the second subpixel SPg, and the third subpixel SPb.

The OLED display 2 may include the first pixel P1 and the second pixel P2 that are disposed along the first direction D1. At least one wiring may be disposed between the first pixel P1 and the second pixel P2 and may extend along the second direction D2 crossing the first direction D1. According to an embodiment, the wiring extending along the second direction D2 may be the data line DLj and/or the power line PL but is not limited thereto.

Each of the first pixel P1 and the second pixel P2 may include the second region 200 through which external light transmits. The second region 200 may be divided by the data line DLj and/or the power line PL disposed between the first pixel P1 and the second pixel P2.

The first capacitor C1 including the first lower electrode 242 and the first upper electrode 244a that include a transparent conductive material may be provided in the second region 200 of the OLED display 2 according to an embodiment. According to an embodiment, at least a part of the first capacitor C1 overlaps the second opening 220b included in the pixel defining layer 220 in a plan view such that the at least a part of the first capacitor C1 corresponds to the second region 200. The first lower electrode 242 of the first capacitor C1 may include polysilicon. The first upper electrode 244a of the first capacitor C1 may include transparent conductive oxide having transmittance higher than about 95%. That is, both the first lower electrode 242 and the first upper electrode 244a may include a transparent or a semi-transparent material, and thus although the first capacitor C1 is provided in the second region 200, external light incident on the OLED display 2 may pass through the second region 200.

Referring to FIG. 7, a buffer layer 211 may be provided over the substrate 10. The first transistor M1, the second capacitor C2, and a fourth transistor M4 may be provided in the first region 100 over the buffer layer 111. The first capacitor C1 may be provided in the second region 200.

The first transistor M1 may include an active layer 222 disposed over the buffer layer 211 and a gate electrode 224 insulated from the active layer 222. The active layer 222 may include a channel region 222C, and a source region 222S and a drain region 222D which are separate from each other with the channel region 222C therebetween.

A gate insulating layer 213 may be disposed between the active layer 222 and the gate electrode 224. The gate insulating layer 213 may extend from the first region 100 to the second region 200. According to an embodiment, the gate insulating layer 213 may be a dielectric layer disposed between the first lower electrode 242 and the first upper electrode 244a of the first capacitor C1.

The gate electrode 224 may include a lower gate electrode 224a including a transparent conductive material and an upper gate electrode 224b provided on the lower gate electrode 224a. According to an embodiment, the lower gate electrode 224a may include ITO having a thickness in a range from about 100 Å to about 500 Å. The upper gate electrode 224b may include a single layer including molybdenum (Mo) or a triple layer structure including Mo/Al/Mo. The lower gate electrode 224a and the upper gate electrode 224b may be formed through a single mask process.

The first capacitor C1 may be provided in the second region 200 over the buffer layer 211. The first capacitor C1 may include the first lower electrode 242 and the first upper electrode 244a. The first lower electrode 242 may be provided at the same layer as the active layer 222 of the first transistor M1 and may include the same material as the source region 222S and the drain region 222D of the active layer 222. That is, the first lower electrode 242 may include doped polysilicon.

The first upper electrode 244a may be provided at the same layer as the lower gate electrode 224a of the first transistor M1, may include the same material as the lower gate electrode 224a, and have the same thickness as the lower gate electrode 224a.

An upper gate insulating layer 215 covering the gate electrode 224 may be provided over the lower gate insulating layer 213. The upper gate insulating layer 215 may have a single layer structure or a double layer structure including an inorganic material such as silicon nitride ($SiN_x$) and/or silicon oxide ($SiO_2$). The upper gate insulating layer 215 may include a fifth opening 215a corresponding to at least the second region 200.

A second upper electrode 238 of the second capacitor C2 may be provided over the upper gate insulating layer 215. The second upper electrode 238 may have a single layer structure or a multi-layer structure including one or more materials among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). According to an embodiment, the second upper electrode 238 may include a single layer including molybdenum (Mo) or a triple layer structure including Mo/Al/Mo.

The second upper electrode 238 may face the gate electrode 224 and may constitute the second capacitor C2, along with the gate electrode 224. That is, the gate electrode 224 may function as the gate electrode 224 of the first transistor M1 and a second lower electrode of the second capacitor C2. That is, the first transistor M1 and the second capacitor C2 that occupy a wide area in the pixel circuit PC may be formed to overlap with each other in a plan view in order to secure a channel length, thereby reducing an area of the pixel circuit PC while implementing the second capacitor C2 of a high capacity, which may be suitable for implementing the OLED display 2 of a high resolution and may increase an area of the second region 200, thereby enhancing the second region 200.

An interlayer insulating layer 217 covering the second upper electrode 238 may be provided over the upper gate insulating layer 215. The interlayer insulating layer 217 may include a third opening 217a corresponding to at least the second region 200. The third opening 217a and the fifth opening 215a may be formed by the same etching process.

The fourth transistor M4 may be further provided in the first region 100 over the buffer layer 211 in addition to the first transistor M1. The fourth transistor M4 may be disposed between the first transistor M1 and the first electrode 250 of the organic light-emitting diode OLED. The first transistor M1 may be electrically connected to the first electrode 250 via the fourth transistor M4. According to an embodiment, the fourth transistor M4 may be a light-emitting control transistor but the described technology is not limited thereto.

The fourth transistor M4 may include an active layer 282 including a source region 282S, a drain region 282D, and a channel region 282C, a gate electrode 284, and a source electrode 288S and a drain electrode 288D electrically connected to the source region 282S and the drain region 282D of the active layer 282 respectively.

The active layer 282 and the gate electrode 284 of the fourth transistor M4 may be provided at the same layers as and include the same materials as the active layer 222 and the gate electrode 224 of the first transistor M1. The source region 282S and the drain region 282D may be provided over the interlayer insulating layer 217. The gate electrode 284 of the fourth transistor M4 may include a lower layer 284a provided at the same layer as the lower gate electrode 224a of the first transistor M1 and an upper layer 284b provided at the same layer as the upper gate electrode 224b of the first transistor M1.

According to an embodiment, the data line DLj disposed between the first pixel P1 and the second pixel P2 is provided at the same layer as and include the same materials as the source electrode 288S and the drain electrode 288D.

The source electrode 288S, the drain electrode 288D, and the data line DLj may have a single layer structure or a multi-layer structure including one or more materials among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). According to an embodiment, the source electrode 288S, the drain electrode 288D, and the data line DL may have a triple layer structure including Mo/Al/Mo or Ti/Al/Ti.

A via insulating layer 219 covering the first transistor M1, the fourth transistor M4, and the second capacitor C2 may be disposed over the interlayer insulating layer 217, and may include an organic material. The via insulating layer 219 may include a fourth opening 219a corresponding to the second region 200.

At least a part of the first upper electrode 244a may be exposed by the fifth opening 215a, the third opening 217a, and the fourth opening 219a that are respectively included in the upper gate insulating layer 215, the interlayer insulating layer 217, and the via insulating layer 219. According to an embodiment, an area of the third opening 217a and the fifth opening 215a may be greater than an area of the fourth opening 219a, and the via insulating layer 219 may be in direct contact with a part of an upper surface of the first upper electrode 244a exposed by the third opening 217a and the fifth opening 215a. That is, the via insulating layer 219 may cover an edge region of the first upper electrode 244a, and a region of the first upper electrode 244a, excluding the edge region covered by the via insulating layer 219, may be exposed by the fourth opening 219a. The first upper electrode 244a may be disposed between one region of the via insulating layer 219 and the interlayer insulating layer 217, thereby preventing the via insulating layer 219 from being separated from the interlayer insulating layer 217.

The OLED that includes the first electrode 250, the second electrode 270 facing the first electrode 250, and the intermediate layer 260 disposed between the first electrode 250 and the second electrode 270 and including the organic emission layer 262 may be disposed in the first region 100 over the via insulating layer 219. The first electrode 250 may be electrically connected to the drain electrode 288D of the fourth transistor M4 through the via hole VIA in the via insulating layer 219.

Both edges of the first electrode 250 may be covered by the pixel defining layer 220. The pixel defining layer 220 may include the first opening 220a exposing a part of the first electrode 250 and the second opening 220b corresponding to the second region 200. According to an embodiment, an area of the second opening 220b of the pixel defining layer 220 may be greater than an area of the fourth opening 219a included in the via insulating layer 219.

At least a part of the first capacitor C1 may overlap with the second opening 220b along a direction perpendicular to the main surface 10a. That is, the at least a part of the first capacitor C1 may be provided inside the second opening 220b, and thus an upper surface of the first upper electrode 244a may be exposed by the second opening 220b.

The first electrode 250 may be configured as a reflective electrode. The second electrode 270 may be configured as a transparent or semitransparent electrode. That is, the OLED display 2 may be a top emission type.

The intermediate layer 260 including the organic emission layer 262 may be disposed between the first electrode 250 and the second electrode 270. A common layer that is common in all the pixels may be disposed between the first electrode 250 and the organic emission layer 262 and between the organic emission layer 262 and the second electrode 270. According to an embodiment, a first common layer 261 may be disposed between the first electrode 250 and the organic emission layer 262. A second common layer 263 may be disposed between the organic emission layer 262 and the second electrode 170.

According to an embodiment, the first common layer 261 and the second common layer 263 are disposed in the first region 100 and the second region 200. The second region 270 may include a sixth opening 270a corresponding to the second region 200. The sixth opening 270a may be formed in the second region 200, thereby enhancing transmittance of the second region 200 and preventing parasitic capacitance from occurring due to the first upper electrode 244a and the second electrode 270.

Figure 8:
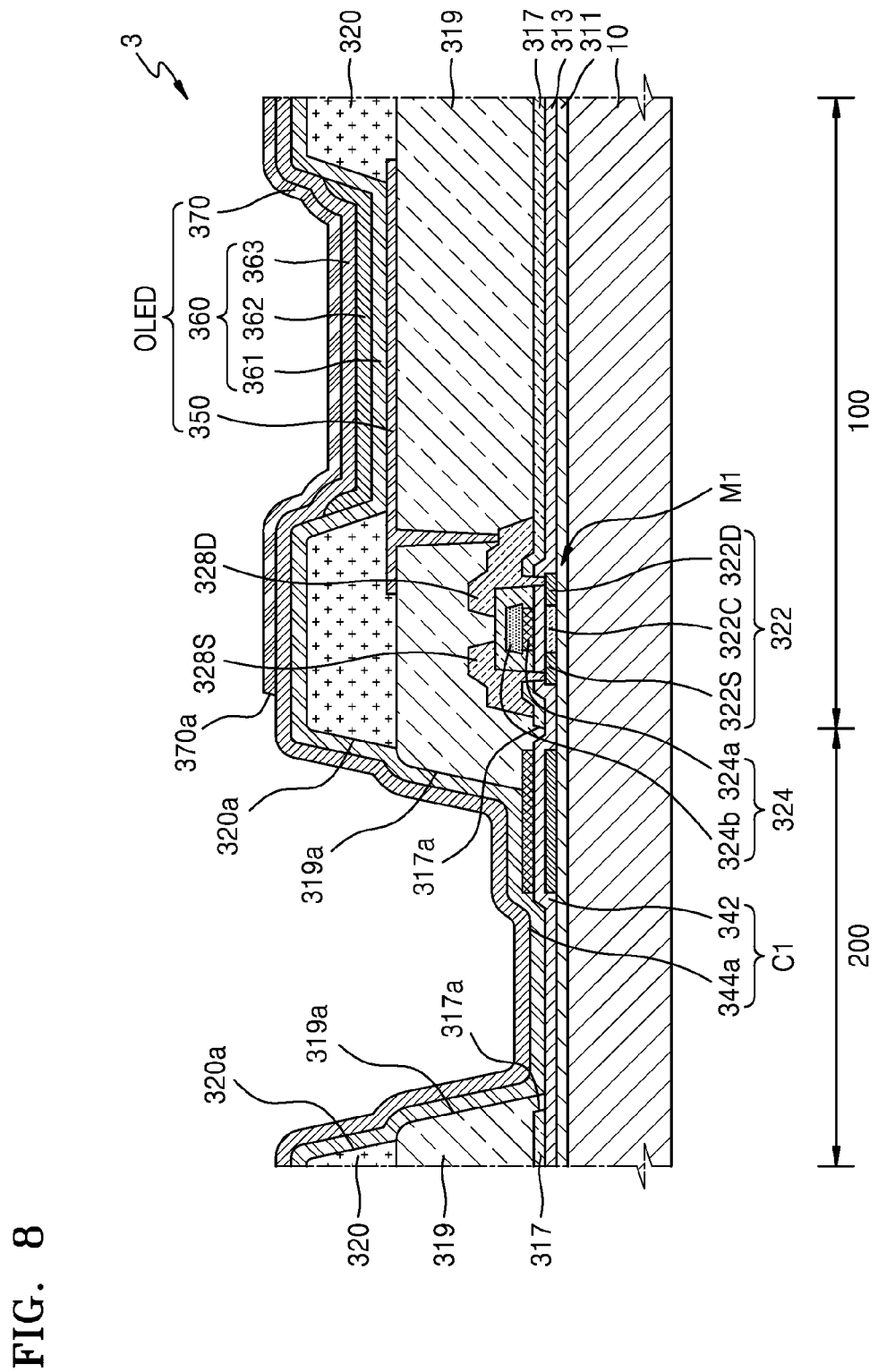
FIG. 8 is a cross-sectional view schematically illustrating an OLED display according to another embodiment.

FIG. 8 is a cross-sectional view schematically illustrating an OLED display 3 according to another embodiment.

Referring to FIG. 8, the OLED display 3 includes the substrate 10 including the main surface 10a and a pixel disposed on the main surface 10a of the substrate 10 and includes the first region 100 configured to display an image and the second region 200 through which external light is transmitted. The pixel may include the first transistor M1 provided in the first region 100, the first capacitor C1 provided in the second region 200 and including a first lower electrode 342 and a first upper electrode 344a facing the first lower electrode 342, a first electrode 350 electrically connected to the first transistor M1 and provided in the first region 100, a pixel defining layer 320 provided in at least the first region 100 and including a first opening 320a exposing a part of the first electrode 350 and a second opening 320b corresponding to the second region 200, the second electrode 370 facing the first electrode 350, and an intermediate layer 360 disposed between the first electrode 350 and the second electrode 370 and including an organic emission layer 362. At least a part of the first capacitor C1 may overlap with at least a part of the second opening 320b along a direction perpendicular to the main surface 10a.

The substrate 10 may be formed of glass, plastic, etc. A buffer layer 311 may be provided over the substrate 10. The first transistor M1 may be provided in the first region 100 over the buffer layer 311 and may include an active layer 322 and a gate insulating layer 324 insulated from the active layer 322.

The active layer 322 may include a channel region 322C, and a source region 322S and a drain region 322D which are separate from each other with the channel region 322C therebetween. The gate electrode 324 may include a lower gate electrode 324a and an upper gate electrode 324b. A gate insulating layer 313 may be disposed between the active layer 322 and the gate electrode 324. The gate insulating layer 313 may extend from the first region 100 to the second region 200. According to an embodiment, the lower gate insulating layer 213 may be a dielectric layer disposed between the first lower electrode 342 and the first upper electrode 344a of the first capacitor C1.

The gate electrode 324 may include a lower gate electrode 324a including a transparent conductive material and an upper gate electrode 324b provided on the lower gate electrode 324a. According to an embodiment, the lower gate electrode 324a may include ITO having a thickness in a range from about 100 Å to about 500 Å. The upper gate electrode 324b may include a single layer including molybdenum (Mo) or a triple layer structure including Mo/Al/Mo. The lower gate electrode 324a and the upper gate electrode 324b may be formed through a single mask process.

The first capacitor C1 may be provided in the second region 200 over the buffer layer 311. The first capacitor C1 may include the first lower electrode 342 and the first upper electrode 344a. The first lower electrode 342 may be provided at the same layer as the active layer 322 of the first transistor M1 and may include the same material as the source region 322S and the drain region 322D of the active layer 322. That is, the first lower electrode 342 may include doped polysilicon.

The first upper electrode 344a may be provided at the same layer as the lower gate electrode 324a of the first transistor M1, may include the same material as the lower gate electrode 324a, and have the same thickness as the lower gate electrode 324a.

An interlayer insulating layer 317 covering the gate electrode 324 may be provided over the gate insulating layer 313. The interlayer insulating layer 317 may include a third opening 217a corresponding to at least the second region 200. The interlayer insulating layer 317 may have a single layer structure or a double layer structure including an inorganic material such as silicon nitride ($SiN_x$) and/or silicon oxide ($SiO_2$).

A source region 328S and a drain region 328D respectively connected to the source region 322S and the drain region 322D of the active layer 322 may be provided over the interlayer insulating layer 317. The interlayer insulating layer 317 may include a third opening 317a corresponding to at least the second region 200.

A via insulating layer 319 covering the source electrode 328S and the drain electrode 328D may be provided over the interlayer insulating layer 217 and may include an organic material. The via insulating layer 319 may include a fourth opening 319a corresponding to the second region 200.

The OLED that includes the first electrode 350, the second electrode 370 facing the first electrode 350, and the intermediate layer 360 disposed between the first electrode 350 and the second electrode 370 and including the organic emission layer 362 may be disposed in the first region 100 over the via insulating layer 319. The first electrode 350 may be electrically connected to the drain electrode 328D of the first transistor M1 through the via hole VIA in the via insulating layer 319.

Both edges of the first electrode 350 may be covered by the pixel defining layer 320. The pixel defining layer 320 may include the first opening 320a exposing a part of the first electrode 350 and the second opening 320b corresponding to the second region 200. According to an embodiment, an area of the second opening 320b of the pixel defining layer 320 may be greater than an area of the fourth opening 319a included in the via insulating layer 319.

At least a part of the first capacitor C1 may overlap with the second opening 320b along a direction perpendicular to the main surface 10a. That is, the at least a part of the first capacitor C1 may be provided inside the second opening 320b, and thus the upper surface of the first upper electrode 344a may be exposed by the second opening 320b.

The first electrode 350 may be a transparent or semitransparent electrode. According to an embodiment, the first electrode 350 may include a transparent conductive layer and a semitransparent layer. The transparent conductive layer may be at least one selected from the group consisting of ITO (indium tin oxide), IZO (indium zinc oxide), ZnO (zinc oxide), $In_2O_3$ (indium oxide), IGO (indium galium oxide), and AZO (aluminum zinc oxide). The semitransparent layer may be at least one selected from the group consisting of Ag, Mg, Al, Pt, Pd, Au, Ni, Nd, Ir, Cr, Li, Ca, and Yb formed as a thin film having a thickness in a range from several nm to several tens nm.

The second electrode 370 may be configured as a reflective electrode and may be at least one selected from the group consisting of Ag, Al, Mg, Li, Ca, Cu, LiF/Ca, LiF/Al, MgAg, and CaAg. The second electrode 370 may include a sixth opening 370a provided in the second region 200.

The intermediate layer 360 including the organic emission layer 362 may be disposed between the first electrode 350 and the second electrode 370. The intermediate layer 360 may include a first common layer 361 disposed between the first electrode 350 and the organic emission layer 362 and a second common layer 363 disposed between the organic emission layer 362 and the second electrode 370. The first common layer 361 and the second common layer 363 may be disposed in the first region 100 and the second region 200.

The OLED display 3 may be a bottom emission type, and devices included in the pixel circuit PC of FIG. 2 may not be provided between the substrate 10 and the first electrode 350 such that light emitted from the organic emission layer 362 is not refracted and/or reflected and is extracted to the outside through the substrate 30.

The OLED displays 1, 2, and 3 may include the first capacitor C1 included in the pixel circuit PC including a transparent material and provided in the second region 200, thereby securing a space in which the pixel circuit PC is to be provided. The first capacitor C1 may be provided not to overlap with other devices included in the pixel circuit PC in a plan view, thereby preventing defects such as short circuit due to a step difference caused by lower impurities and that easily occurs when many layers are stacked.

The first capacitor C1 may be easily formed in the second region 200 without adding a mask.

According to at least one of the embodiments, a capacitor included in a pixel circuit may include a transparent material and may be provided in external light transmission region, thereby securing a space in which the pixel circuit is to be provided, and the capacitor may be provided not to overlap with other devices included in the pixel circuit in a plan view, thereby preventing defects such as short circuit due to a step difference caused by lower impurities and that easily occurs when many layers are stacked.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. An organic light-emitting diode (OLED) display comprising:
    a substrate having a main surface; and
    a pixel provided over the main surface of the substrate and defined by a first region configured to display an image and a second region configured to transmit external light,
    wherein the pixel comprises:
    a first transistor provided in the first region;
    a first capacitor provided in the second region and comprising a first lower electrode and a first upper electrode facing the first lower electrode;
    a first electrode electrically connected to the first transistor and provided in the first region;
    a pixel defining layer provided in at least the first region, wherein the pixel defining layer has a first opening exposing a part of the first electrode and a second opening disposed in the second region;
    a second electrode opposing the first electrode; and
    an intermediate layer disposed between the first and second electrodes and comprising an organic emission layer, wherein the first capacitor at least partially overlaps the second opening along a direction perpendicular to the main surface.

2. The OLED display of claim 1, wherein the first lower electrode of the first capacitor comprises polysilicon, and wherein the first upper electrode comprises transparent conductive oxide.

3. The OLED display of claim 2, wherein the transparent conductive oxide comprises indium tin oxide (ITO) having a thickness in a range from about 100 Å to about 500 Å.

4. The OLED display of claim 1, wherein the first transistor comprises an active layer and a gate electrode insulated from the active layer.

5. The OLED display of claim 4, wherein the gate electrode comprises a lower gate electrode and an upper gate electrode provided over the lower gate electrode.

6. The OLED display of claim 5, wherein an upper surface of the lower gate electrode and a lower surface of the upper gate electrode are in contact with each other, and wherein the upper surface of the lower gate electrode has a width less than that of the lower surface of the upper gate electrode.

7. The OLED display of claim 5, wherein the first lower electrode of the first capacitor is provided on the same layer as the active layer, and wherein the first upper electrode is provided on the same layer as the lower gate electrode.

8. The OLED display of claim 4, wherein the gate electrode of the first transistor is electrically connected to the first upper electrode.

9. The OLED display of claim 4, further comprising:
a source electrode and a drain electrode provided over the gate electrode and electrically connected to the active layer;
a gate insulating layer disposed between the active layer and the gate electrode;
an interlayer insulating layer disposed between the gate electrode and the source electrode and between the gate electrode and the drain electrode; and
a via insulating layer provided over the interlayer insulating layer to cover the source and drain electrodes.

10. The OLED display of claim 9, further comprising: a second capacitor provided in the first region and electrically connected to the first capacitor.

11. The OLED display of claim 10, wherein the second capacitor comprises a second lower electrode provided on the same layer as the gate electrode and a second upper electrode provided on the same layer as the source and drain electrodes.

12. The OLED display of claim 9,
wherein the gate insulating layer and the interlayer insulating layer have a single layer structure including an inorganic material or a double layer structure, and
wherein the via insulating layer has a single layer structure including an organic material.

13. The OLED display of claim 12,
wherein the interlayer insulating layer and the via insulating layer respectively have a third opening and a fourth opening disposed in the second region, and
wherein at least a part of the first upper electrode is exposed by the second opening, the third opening, and the fourth opening.

14. The OLED display of claim 13,
wherein the intermediate layer comprises a first common layer disposed between the first electrode and the organic emission layer and a second common layer disposed between the organic emission layer and the second electrode, and
wherein the first and second common layers extend from the first region to an upper surface of the first upper electrode.

15. The OLED display of claim 14, wherein the second electrode has an opening disposed in the second region.

16. The OLED display of claim 13,
wherein the third opening is greater in area than the fourth opening, and
wherein the via insulating layer comprises a region in direct contact with a part of the upper surface of the first upper electrode.

17. The OLED display of claim 4, further comprising: a second capacitor,
wherein the second capacitor comprises the gate electrode and a second upper electrode facing the gate electrode of the first transistor.

18. The OLED display of claim 1, wherein a ratio of an area of the second opening with respect to an entire area of the pixel is in a range from about 40% to about to about 90%.

19. The OLED display of claim 18, wherein a ratio of an area of a region of the first capacitor overlapping the second opening with respect to the area of the second opening is in a range from about 3% to about 9%.

20. The OLED display of claim 1,
wherein the pixel comprises a plurality of pixels comprising a first pixel, a second pixel, a third pixel, and a fourth pixel disposed along a first direction, and
wherein scan lines or data lines extend along a second direction crossing the first direction at least between the first and second pixels and between the third and fourth pixels.

21. The OLED display of claim 20, wherein the second region of the second pixel and the second region of the third pixel are connected to each other along the first direction.

22. The OLED display of claim 20,
wherein each of the first through fourth pixels comprises a first subpixel, a second subpixel, and a third subpixel disposed in the first region, and
wherein the first subpixel, the second subpixel, and the third subpixel are configured to respectively emit a red light, a green light, and a blue light, respectively.

* * * * *